(12) United States Patent
Oganesian et al.

(10) Patent No.: US 7,935,568 B2
(45) Date of Patent: May 3, 2011

(54) WAFER-LEVEL FABRICATION OF LIDDED CHIPS WITH ELECTRODEPOSITED DIELECTRIC COATING

(75) Inventors: Vage Oganesian, Palo Alto, CA (US); David Ovrutsky, Ashkelon (IL); Charles Rosenstein, Ramat Beit Shemesh (IL); Belgacem Haba, Saratoga, CA (US); Giles Humpston, Aylesbury (GB)

(73) Assignee: Tessera Technologies Ireland Limited (IE)

( * ) Notice: Subject to any disclaimer, the term of this patent is extended or adjusted under 35 U.S.C. 154(b) by 0 days.

(21) Appl. No.: 11/590,616

(22) Filed: Oct. 31, 2006

(65) Prior Publication Data

US 2008/0099900 A1    May 1, 2008

(51) Int. Cl.
*H01L 21/44* (2006.01)
*H01L 21/48* (2006.01)
*H01L 21/50* (2006.01)

(52) U.S. Cl. ............... 438/106; 438/113; 438/612

(58) Field of Classification Search .............. 438/22–41, 438/68–73, 611–617, E23.02
See application file for complete search history.

(56) References Cited

U.S. PATENT DOCUMENTS

| | | | |
|---|---|---|---|
| 5,455,455 A | 10/1995 | Badehi | |
| 5,547,906 A | 8/1996 | Badehi | |
| 5,716,759 A | 2/1998 | Badehi | |
| 6,607,941 B2 * | 8/2003 | Prabhu et al. | ............. 438/113 |
| 6,777,767 B2 | 8/2004 | Badehi et al. | |
| 6,781,244 B2 * | 8/2004 | Prabhu | ............. 438/108 |
| 6,835,599 B2 | 12/2004 | Kuan et al. | |
| 6,927,156 B2 | 8/2005 | Mathew | |
| 6,972,214 B2 | 12/2005 | Kuan et al. | |
| 7,030,010 B2 | 4/2006 | Farnworth et al. | |
| 7,057,273 B2 | 6/2006 | Harnden et al. | |
| 7,372,141 B2 | 5/2008 | Karnezos et al. | |
| 2003/0062601 A1 | 4/2003 | Harnden et al. | |
| 2003/0230805 A1 | 12/2003 | Noma et al. | |
| 2004/0107569 A1 * | 6/2004 | Guzek et al. | ............. 257/782 |
| 2004/0150097 A1 | 8/2004 | Gaynes et al. | |
| 2005/0079721 A1 | 4/2005 | Buerger et al. | |
| 2005/0104187 A1 | 5/2005 | Polsky et al. | |
| 2005/0145998 A1 | 7/2005 | Harnden et al. | |
| 2005/0215042 A1 | 9/2005 | Hille et al. | |
| 2005/0258549 A1 | 11/2005 | Mathew | |
| 2006/0068580 A1 * | 3/2006 | Dotta | ............. 438/612 |

FOREIGN PATENT DOCUMENTS

EP    1471571    10/2004
FR    2854498    11/2004

* cited by examiner

*Primary Examiner* — Cuong Q Nguyen
(74) *Attorney, Agent, or Firm* — Lerner, David, Littenberg, Krumholz & Mentlik, LLP

(57) ABSTRACT

A method is provided for fabricating a unit including a semiconductor element such as a sensor unit, e.g., for optical imaging. A semiconductor element has plurality of conductive features exposed at the front surface and semiconductive or conductive material exposed at least one of the front and rear surfaces. At least some of the conductive features are insulated from the exposed semiconductive or conductive material. By electrodeposition, an insulative layer is formed to overlie the at least one of exposed semiconductive material or conductive material. Subsequently, a plurality of conductive contacts and a plurality of conductive traces are formed overlying the electrodeposited insulative layer, the conductive traces connecting the conductive features to the conductive contacts. The unit can be incorporated in a camera module having an optical element in registration with an imaging area of the semiconductor element.

28 Claims, 15 Drawing Sheets

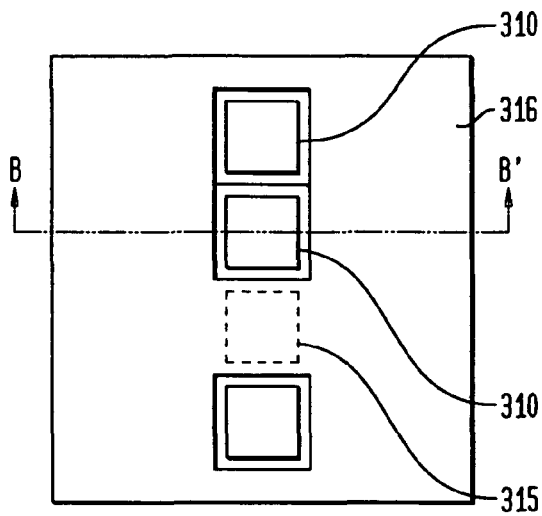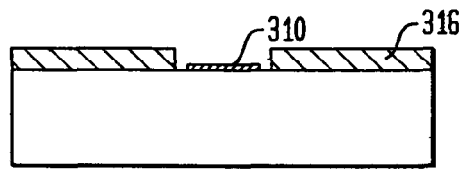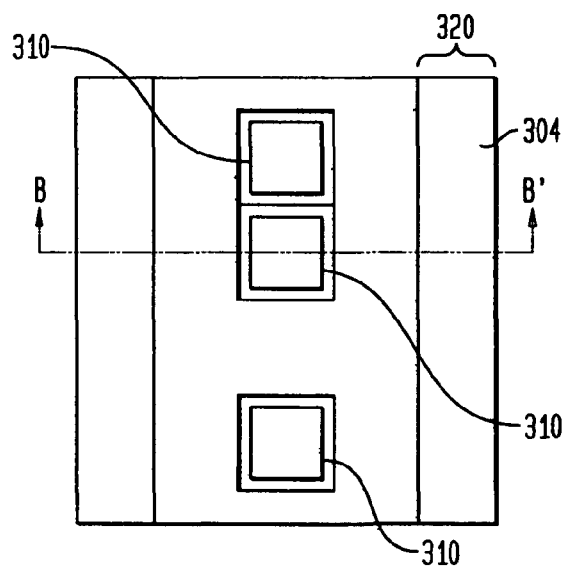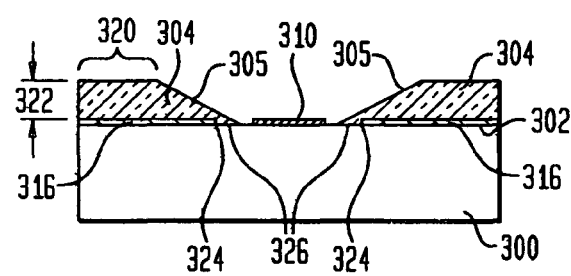

WAFER-LEVEL FABRICATION OF LIDDED CHIPS WITH ELECTRODEPOSITED DIELECTRIC COATING

BACKGROUND OF THE INVENTION

The present invention relates to packaging of microelectronic devices, especially the packaging of semiconductor devices.

Certain types of microelectronic devices and semiconductor chips include devices such as acoustic transducers, radio frequency emitters and/or detectors and/or optoelectronic devices. Such devices typically require packaging which permits the passage of energy, e.g., acoustic, radio frequency or optical wavelength energy to and from devices at a face of a semiconductor chip.

Because such devices are often exposed at a front face of the microelectronic devices, they usually require protection from the elements, such as dust, other particles, contaminants and/or humidity. For this reason, it is advantageous to assemble the microelectronic device with a lid or other element covering the front face of such microelectronic device at an early stage of processing.

Other types of microelectronic devices require ease of testing. These goals are furthered in some packaged semiconductor chips and modules incorporating chips through use of a compliant pin-grid array or compliant ball-grid array ("BGA") external interface. Compliant pin-grid array interfaces allow chips, especially for certain types of devices such as dynamic random access memories ("DRAMs") to be temporarily connected to inexpensive fixtures for a variety of post-production testing, including burn-in tests and thermal stress tests. After such testing, the pin grid array interface allows the chip to be removed from the fixture and then installed more permanently in a final system.

For high speed performance, some types of chip packages incorporate controlled impedance transmission lines between contacts of the semiconductor chips and the external contacts of the package. It is particularly important to control the impedance seen by the wiring in a package where distances between pads of the chip and the external contacts of the package are long.

Certain types of mass-produced chips such as DRAMs also require packaging costs to be tightly controlled. Processing used to package such semiconductor chips can be performed on many chips simultaneously while the chips remain attached to each other in form of a wafer or portion of a wafer. Such "wafer-level" processing typically is performed by a sequence of processes applied to an entire wafer, after which the wafer is diced into individual chips. Advantageously, wafer-level packaging processes produce packaged chips which have the same area dimensions as the original semiconductor chips, making their interconnection compact on circuit panels and the like.

Heretofore, wafer-level packaging processes have not been available for fabricating chips having pin-grid array interfaces or compliant ball-grid array ("BGA") interfaces which keep costs low while also incorporating controlled impedance transmission lines for high-speed performance.

SUMMARY OF THE INVENTION

In accordance with one aspect of the invention, a method is provided of fabricating a unit which includes a semiconductor element e.g., portion of wafer or chip. In such method, a semiconductor element is provided which has a front surface and a rear surface remote from the front surface. At least one of conductive material or semiconductive material is exposed at least one of the front and rear surfaces of the semiconductor element. A plurality of first conductive contacts are exposed at the front surface. At least some of the first conductive contacts are insulated from the at least one of exposed semiconductive material or conductive material. An insulative layer is electrodeposited onto the exposed semiconductive or conductive material. Then, a plurality of second conductive contacts and a plurality of conductive traces are formed. The second conductive contacts and the plurality of conductive traces overlie the insulative layer and conductively connect the first conductive contacts to the second conductive contacts.

In accordance with another aspect of the invention, a method is provided for fabricating a unit which includes a semiconductor element, e.g., portion of wafer or chip. In such method, a semiconductor element is assembled with a cover element to form a unit which has an exterior major surface parallel to a front face of the semiconductor element. A plurality of semiconductor devices are included in the semiconductor element. A first insulative layer overlies the front face of the semiconductor element and a plurality of conductive features overlie the first insulative layer and are conductively connected to the semiconductor devices. In addition, at least one of the semiconductor element or the cover element has transverse surfaces which extend inwardly from the exterior major surface of the unit. A second insulative layer is electrodeposited to overlie the transverse surfaces and at least a portion of the exterior major surface. Then, a plurality of conductive traces are formed which overlie the second insulative layer along portions of the transverse surfaces and the exterior major surface, the plurality of conductive traces being connected to the plurality of conductive features.

In accordance with one or more preferred aspects of the invention, a method is provided for fabricating a camera module which includes the unit and an optical unit having an optical element separated from an imaging area of the semiconductor element by the cover element.

In accordance with one or more preferred aspects of the invention, the semiconductor element includes a rear face remote from the front face and the exterior major surface of the unit includes at least a portion of the rear face of the semiconductor element.

In accordance with one or more preferred aspects of the invention, at least some of the plurality of transverse surfaces coincide with openings extending from the rear surface of the semiconductor element to the first insulative layer, and the second insulative layer is electrodeposited onto the rear face and the openings.

In accordance with one or more preferred aspects of the invention, at least some of the plurality of transverse surfaces coincide with edges extending from the rear surface of the semiconductor element to the first insulative layer, and the second insulative layer is electrodeposited onto the rear face and the edges.

In accordance with one or more preferred aspects of the invention, the cover element has an outer surface remote from the front face of the semiconductor element and the cover element includes a dielectric material exposed at the outer surface.

In accordance with one or more preferred aspects of the invention, the semiconductor element includes a plurality of chips joined together at a plurality of dicing lanes, wherein when the second insulative layer is deposited, at least some of the plurality of conductive features are disposed adjacent to each other across ones of the plurality of dicing lanes and the at least some conductive features are conductively connected to each other by conductive elements extending across the plurality of dicing lanes. The semiconductor element may then be severed along the dicing lanes into a plurality of individual chips.

In accordance with one or more preferred aspects of the invention, the step of assembling the semiconductor element with the cover element is performed when the semiconductor element has an essentially continuous rear surface and the cover element has an essentially continuous outer surface, the method further comprising forming the plurality of openings by removing semiconductor material from the semiconductor element.

In accordance with one or more preferred aspects of the invention, the semiconductor element may be ground from the rear face to reduce the thickness of the semiconductor element prior to forming the plurality of openings.

In accordance with one or more preferred aspects of the invention, the plurality of openings can be formed by etching the semiconductor element. For example, the semiconductor element can be etched by applying an etchant through openings in a mask layer, the etchant not attacking the first insulative layer during the etching of the semiconductor element. The plurality of openings can even be extended through the first insulative layer to expose at least some of the conductive features after the step of electrodepositing the second insulative layer.

In accordance with one or more preferred aspects of the invention, the step of forming the plurality of traces includes depositing a metal layer onto the at least some conductive features, and onto the second insulative layer overlying the openings in the semiconductor element and the rear face of the semiconductor element. The metal layer can be deposited, for example, by sputtering, chemical vapor deposition ("CVD"), or electroless plating followed by a step of electrolytic plating.

In one embodiment, the metal layer is conformally deposited to overlie at least the rear face and walls of the openings, the plurality of conductive traces include a plurality of first metal patterns photolithographically defined from the metal layer, and the step of forming the plurality of conductive traces further includes plating a second metal layer onto the plurality of first metal patterns.

In a particular embodiment, the metal layer is conformally deposited to overlie at least the rear face and walls of the openings, and the step of forming the plurality of traces includes photolithographically defining first metal patterns from the metal layer, and plating a second metal layer onto the plurality of first metal patterns.

Exemplary structures include aluminum in the first metal layer, and nickel in the second metal layer, the metal layer being deposited by sputtering, for example. In a particular embodiment, the metal layer may include titanium, and the second metal layer include nickel, the metal layer being deposited, for example, by sputtering. A third metal layer can be deposited to overlie the second metal layer, where the third metal layer includes a metal such as copper.

In accordance with one or more preferred aspects of the invention, a dielectric masking layer is deposited to overlie the plurality of conductive traces and rear surface. The masking layer has mask openings aligned with at least some of the plurality of conductive traces. A plurality of external contacts are formed within the mask openings, and the plurality of external contacts conductively contact the plurality of traces.

In accordance with one or more preferred aspects of the invention, the plurality of external contacts are formed by processing including plating a third metal layer onto the traces exposed within the openings in the masking layer.

In accordance with one or more preferred aspects of the invention, the step of forming the plurality of external contacts includes forming a plurality of metallic bumps.

In accordance with one or more preferred aspects of the invention, the step of electrodepositing the second insulative layer includes contacting an exterior surface of the unit with a fluid polymeric composition and applying a current through the fluid composition to electrophoretically deposit the second insulative layer. In one example, the fluid polymeric composition includes a cathodic epoxy composition. In another example, the fluid polymeric composition includes an anodic composition.

In accordance with another aspect of the invention, a packaged semiconductor chip is provided which includes a semiconductor element having a front surface and a rear surface remote from the front surface. At least one of conductive material or semiconductive material is present at at least one of the front and rear surfaces. A plurality of conductive features are exposed at the front surface, the conductive features being insulated from the exposed semiconductive or conductive material. An insulative layer having an inner surface contacting and conforming to the conductive or semiconductive material overlies the front surface and/or rear surface. The insulative layer further has an outer surface which is remote from the inner surface. A plurality of conductive contacts extend along the outer surface of the insulative layer. Conductive traces extend along the outer surface of the insulative layer, the conductive traces connecting the conductive features to the conductive contacts.

In accordance with another aspect of the invention, a unit is provided which includes a packaged semiconductor chip. A semiconductor element has a front face and a rear face remote from the front face. A plurality of semiconductor devices are accessible conductively through at least one of the front or rear faces. A first insulative layer overlies the front face and a plurality of conductive features overlie the first insulative layer and are conductively connected to the plurality of semiconductor devices. A cover element overlies the front face of the semiconductor element such that the cover element is assembled with the semiconductor element to form a unit. In such unit, at least one of the rear face of the semiconductor element or an outer surface of the cover element is exposed at an exterior major surface of the unit. The unit further includes a plurality of transverse surfaces which extend from the exterior major surface in a direction towards the front face of the semiconductor element. In addition, a polymeric insulative layer conformally covers the transverse surfaces of the semiconductor element and at least a portion of the exterior major surface.

A plurality of conductive traces overlie the polymeric insulative layer, the conductive traces extending from the conductive features onto portions of the exterior major surface covered by the polymeric insulative layer. These conductive traces conductively connect the conductive features to exterior contact pads which overlie the exterior major surface.

Preferably, a thickness of the polymeric insulative layer is substantially uniform where the polymeric insulative layer covers the plurality of transverse surfaces and the exterior major surface.

In one embodiment, the plurality of transverse surfaces include walls of openings extending from the rear surface of the semiconductor element to the first insulative layer. The openings are disposed in registration with the conductive features, and the polymeric insulative layer overlies at least the rear face of the semiconductor element and at least some of the plurality of conductive traces extend from the conductive features onto the rear face.

In another embodiment, the plurality of transverse surfaces include edges of the semiconductor element extending from the rear surface of the semiconductor element to the first insulative layer. The polymeric insulative layer overlies at least the rear face of the semiconductor element. Here again, at least some of the plurality of conductive traces extend from the conductive features onto the rear face.

In accordance with one or more preferred aspects of the invention, at least the outer surface of the cover element consists essentially of a dielectric material.

Moreover, the semiconductor element may further include a plurality of chips joined together at a plurality of dicing lanes, or may include only a single chip.

In a particular embodiment, the conductive traces include a first metal layer having a first thickness and a second metal layer having a second thickness substantially greater than the first thickness. An exemplary first metal layer includes at least one of aluminum or titanium, and the second metal layer includes nickel. A third metal layer may overlie the second metal layer, the third metal layer including another metal such as copper.

In a particular embodiment, a plurality of metallic bumps overlie the rear surface of the semiconductor element, the plurality of metallic bumps being conductively connected to the plurality of conductive traces.

In accordance with one or more preferred aspects of the invention, the polymeric insulative layer includes an epoxy.

In a particular embodiment of the invention, a camera module is provided which includes the foregoing described unit and an optical unit having an optical element separated from an imaging area of the semiconductor element by the cover element.

BRIEF DESCRIPTION OF THE DRAWINGS

FIGS. 15A through 19B are plan views and corresponding sectional views illustrating stages in fabrication of a packaged chip in accordance with another embodiment of the invention.

DETAILED DESCRIPTION

Figure 1:
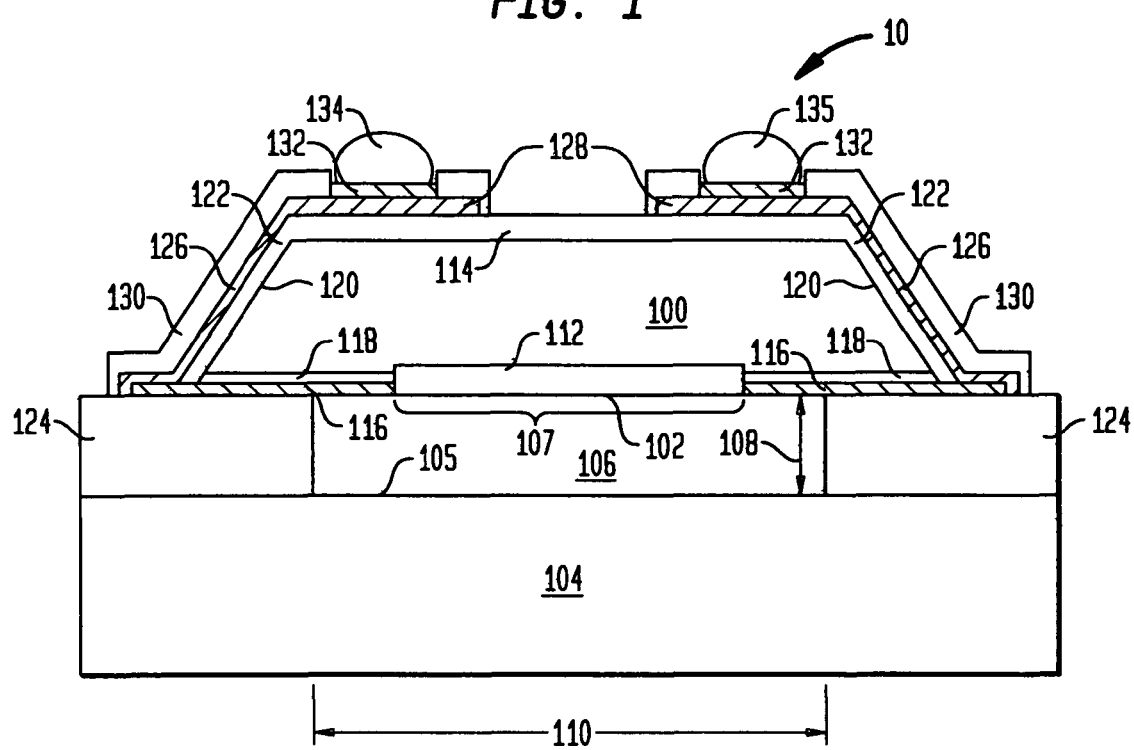
FIG. 1 is a sectional view illustrating a packaged chip in accordance with an embodiment of the invention.

FIG. 1 is a sectional view of a packaged semiconductor chip 10 in accordance with an embodiment of the invention. As illustrated in FIG. 1, the packaged chip is shown in an orientation in which a front face 102 of the semiconductor chip faces downwardly. As illustrated in FIG. 1, the packaged chip includes a semiconductor chip 100 having a front face 102 and a rear face 114 remote from the front face. The front face of the chip 100 is covered by a lid or cover 104 which is assembled together with the semiconductor chip 100 to form the packaged chip 10. As illustrated in FIG. 1, the front face 102 of the semiconductor chip 100 is oriented downwardly towards an upwardly facing inner surface 105 of the lid 104. The semiconductor chip 100 typically includes a semiconductor substrate in which one or a plurality of semiconductor devices 112 are disposed in a device region thereof below the front face 102. The semiconductor chip 100 also includes a plurality of dielectric layers overlying the substrate, in which conductive metal wiring layers and vias (not shown) are disposed. The semiconductor devices 112 are disposed at the front face of the chip and/or between the front and rear faces of the chip.

The semiconductor chip 100 typically is connected to the lid 104 through one or more standoff structures 124, which may include an adhesive, an inorganic or organic material and/or a joining metal. Structures for supporting a lid at a constant spacing from a chip are described in the commonly owned U.S. Provisional Application No. 60/761,171 filed on Jan. 23, 2006, and U.S. Provisional Application No. 60/775,086 filed on Feb. 21, 2006, the disclosures of which are hereby incorporated herein by reference. The packaged chip may include an interior cavity 106 between the front face 102 of the chip and the inner surface 105 of the lid 104, as illustrated in FIG. 1. Alternatively, the packaged chip 10 can be constructed without an interior cavity. When the cavity is present, the cavity's height 108 and the lateral dimensions, including lateral dimension 110, are typically determined, as for example, by the height and dimensions of the structure 124 used to assemble the lid 104 with the semiconductor chip

100. In a particular embodiment, the lid 104 consists essentially of a glass or polymeric material and is at least partially transparent to electromagnetic spectra at frequencies of interest. The lid 104 may be only partially transparent to provide a filter function, or may be essentially transparent to a range of frequencies of interest.

The semiconductor devices 112 in the semiconductor chip 100 typically include electromagnetic transducer devices such as electromagnetic or electro-optic devices which either detect or output electromagnetic radiation. The semiconductor devices may be designed to emit or receive radio frequency and/or optical wavelengths of infrared, visible and/or ultraviolet or higher wavelength spectra including but not limited to x-ray wavelengths. Alternatively, the semiconductor devices 112 can include acoustic transducer devices, such devices being designed to convert sound pressure waves received through a medium, e.g., air and/or other fluid medium (gas or liquid) to one or more electrical signals, or to convert one or more electrical signals into sound pressure waves.

In a particular embodiment, the packaged chip is a sensor unit in which the semiconductor devices 112 of the chip 100 include an imaging area 107 for capturing an image. Electronic circuits (not shown) in chip 100 are connected to the semiconductor devices in the imaging area 107 for generating one or more electrical signals representing an image captured by the imaging area 107. Numerous electrical circuits are well known in the imaging art for this purpose. For example, the semiconductor chip 100 may be a generally conventional charge-coupled device (CCD) imaging chip with conventional circuits such as clocking and charge-to-voltage conversion circuits.

As seen in FIG. 1, the semiconductor chip includes a plurality of front contact pads 116 overlying an insulative or "passivation" layer 118 at the front face of the semiconductor chip. The passivation layer preferably includes an inorganic dielectric or organic dielectric material. For example, the passivation layer 118 preferably includes a dielectric material such as silicon dioxide, silicon nitride and/or a combination of materials such as a layered stack including silicon dioxide and silicon nitride. While not specifically shown in FIG. 1, the semiconductor devices 112 in the device region are conductively connected to the front contact pads 116. The semiconductor device, thus, are accessible conductively through wiring incorporated within one or more layers of the semiconductor chip 100 below and/or within the passivation layer 118.

As further shown in FIG. 1, a second insulative layer 122 is disposed along edges 120 of the semiconductor chip 100. The insulative layer 122 preferably includes a conformally coated dielectric material. The conformal coating covers at least portions of the edges 120 and rear surface 114 of the chip. Preferably, the conformal coating covers the edges and rear face of the semiconductor chip continuously and uniformly, such that there are no breaks in the conformal coating and the insulative layer 122 provides good dielectric isolation with respect to the semiconductor chip 100.

With further reference to FIG. 1, a plurality of conductive traces 126 conductively connect the front contact pads 116 of the chip to corresponding package contact pads 128 which overlie an exterior surface of the packaged chip 10. As specifically shown in FIG. 1, the package contact pads 128 overlie the rear surface 114 of the semiconductor chip 100. The conductive traces 126 overlie the second insulative layer 122 and extend over portions of the edges 120 and rear surface 114 of the semiconductor chip. The conductive traces 126 preferably connect individual front contact pads 116 of the chip 100 with corresponding individual package contact pads 128 and conductive bumps 134.

As further shown in FIG. 1, a third insulative layer 130 overlies the conductive traces 126 and provides external isolation therefor. This layer can be referred to as an "external passivation layer" 130 of the package 10. In a particular embodiment, a metal structure 132 including a metal layer or stack of metal layers including a wettable metal layer overlies the package contact pads 128, and conductive bumps 134 overlie the metal structure 132. Typically, the conductive bumps 134 include a fusible metal having a relatively low melting temperature such as solder, tin, or a eutectic mixture including a plurality of metals. Alternatively, the bumps 134 include a wettable metal, e.g., copper or other noble metal or non-noble metal having a melting temperature higher than that of solder or other fusible metal. Such wettable metal can be joined with a corresponding feature, e.g., a fusible metal feature of an interconnect element such as a circuit panel to externally interconnect the packaged chip 10 to such interconnect element. In another alternative, the bumps 134 include a conductive material interspersed in a medium, e.g., a conductive or solder-filled paste and/or an isotropic or anisotropic conductive adhesive.

Figure 2:
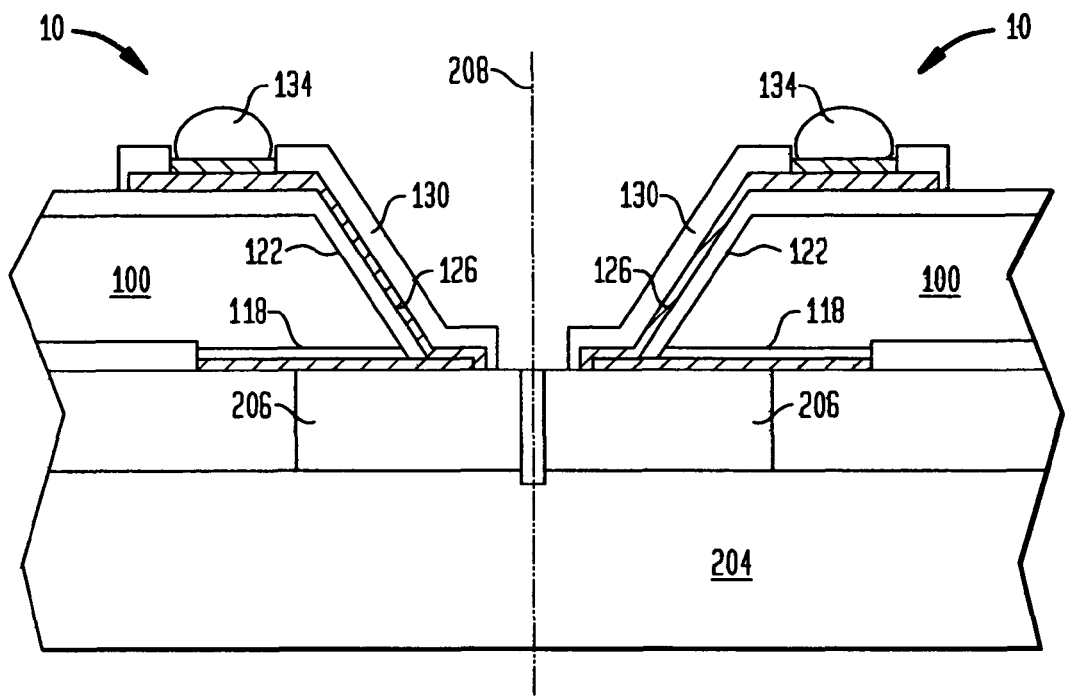
FIG. 2 is a corresponding partial sectional view through portions of two packaged chips which remain connected together along dicing lanes prior to being diced into individual units.

The fabrication of packaged semiconductor chip 10 preferably is performed simultaneously in quantity, i.e., by processing performed simultaneously to a plurality of semiconductor chips while they remain joined together as a portion of or an entire semiconductor device wafer. FIG. 2 is a partial sectional view through portions of two packaged chips 10. The packaged chips 10 include semiconductor chips 100 which remain connected by a standoff structure 206 and a lid element or lid wafer 204 having dimensions corresponding to the semiconductor element or wafer including chips 100. Preferably at a time after the fabrication of the insulative layers 118, 122, conductive traces 126, external passivation layer 130 and conductive bumps 134, the packaged chips 10 are severed from each other along a dicing lane 208 of the lid element 204 to form individual packaged chips 10, each packaged chip 10 being as illustrated in FIG. 1.

Figure 3:
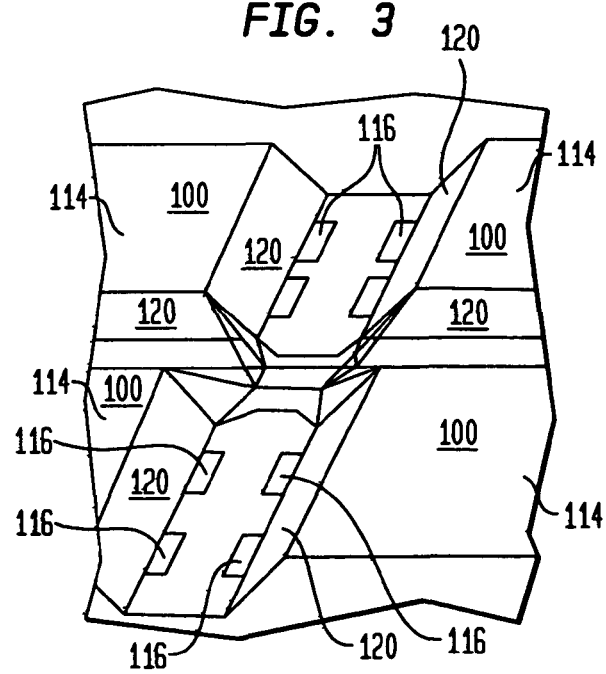
FIG. 3 is a perspective view facing a rear surface of a semiconductor element or wafer, illustrating an intermediate stage in a method of fabricating a packaged chip as illustrated in FIG. 1.

A method of simultaneously fabricating a plurality of packaged chips 10 (FIG. 1) will now be described, with reference to FIGS. 3 through 14. With reference to FIG. 3, to summarize a feature of such method, portions of semiconductor material of a plurality of semiconductor chips 100 which are registered with the front contact pads 116 of the semiconductor chips are removed from a rear face 114 thereof. One or more junction portions 300 of semiconductor material disposed between edges 120 of the semiconductor chips 100 are purposely allowed to remain after this process. The presence of the one or more junction portions 300 provides conductive continuity between exposed external edges of the semiconductor chips 100 during the formation of an dielectric isolation coating 122 (FIG. 1) overlying the edges 120 and rear faces 114 of the semiconductor chips. In a preferred embodiment described below, the dielectric coating 122 is formed by electrodeposition, preferably by electrophoretic deposition of a polymer.

Figure 4A:
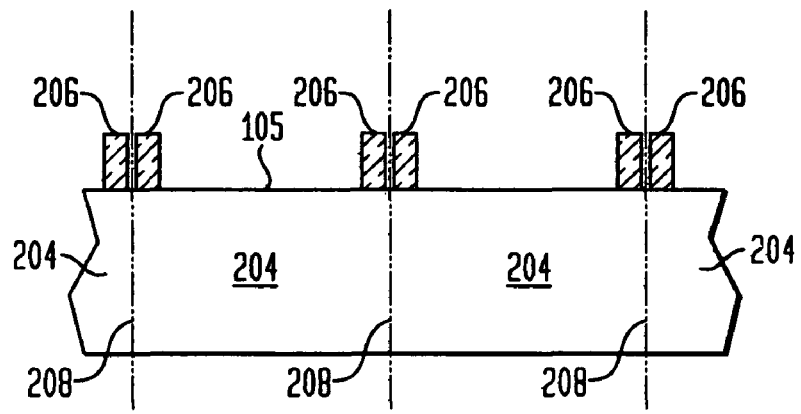
FIGS. 4A through 14 are sectional views illustrating stages in fabrication of a packaged chip as illustrated in FIG. 1, according to an embodiment of the invention.
Figure 4B:
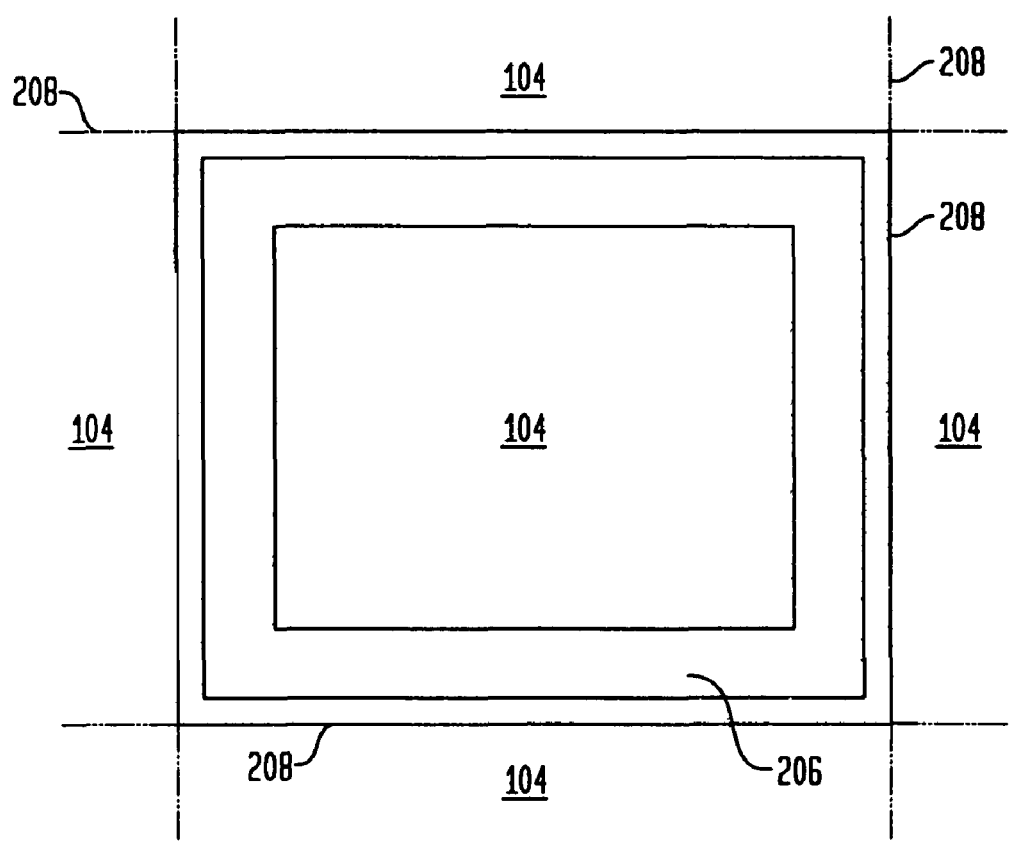

Stages in fabrication of packaged chips 10 (FIG. 1) will now be described with reference to FIGS. 4A through 14. FIG. 4A illustrates a preliminary stage of fabrication in which a plurality of standoff structures 206 are formed extending outward from a major surface of a lid element 204. Each standoff structure 206 typically has a rectangular shape aligned with dicing lanes 208 which lie at the boundaries between individual lids to be severed from the original lid element 204. As illustrated in FIG. 4B, the standoff structure 206 has a form which can be described as that of a "picture frame ring shape." As described above, the standoff structure can include one or more inorganic and/or organic dielectric materials, semiconductors and/or conductors such as one or more metals. The standoff structure can be fabricated by additive and/or subtractive processing, as described in, for example, U.S. patent application Ser. No. 10/949,674 filed Sep. 24, 2004, or U.S. Provisional Application No. 60/761,171, the disclosures of which are hereby incorporated herein by reference. When the standoff structure includes a metal, it can be fabricated by a combination of steps including sputtering of a thin layer of metal followed by subtractive patterning and then electroplating the remaining structure with a final metal. Alternatively, the standoff structure can be formed by electroless plating, followed by subtractive patterning and electroplating.

In a particular embodiment, the standoff structure 206 is fabricated by electrophoretic deposition of a polymer onto a preexisting sputtered or plated conductive layer, in a manner such as that described in the herein incorporated U.S. Provisional Application No. 60/775,086.

Figure 5A:
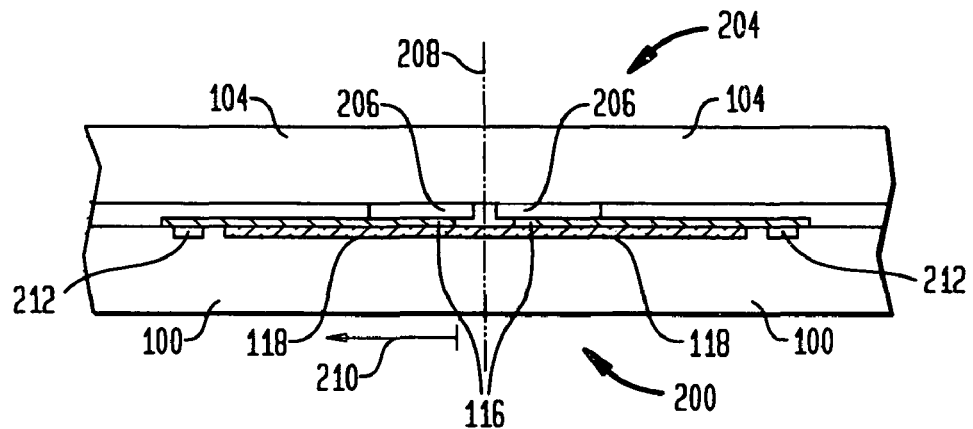

FIG. 5A illustrates a subsequent stage of fabrication after a semiconductor element 200 (a portion of or an entire semiconductor device wafer) has been joined to a corresponding lid element. Prior to being joined with the lid element, a passivation layer 118 and then front contact pads 116 are formed, the front contact pads 116 being exposed at the front surface of each semiconductor chip 100. The front contact pads 116 may be of a type commonly referred to as "compatible pads." Compatible pads are typically formed in such way as to conductively connect to other contacts, e.g., pads 212 of each chip 100 which are farther away (in a lateral direction 210) from the dicing lanes, e.g., dicing lane 208. In one embodiment, the front contact pads 116, e.g., the compatible pads, are not conductively connected to other corresponding front contact pads across the intervening dicing lane 208. However, they can be so connected.

In the partial sectional view shown in FIG. 5A, portions of two semiconductor chips 100 of a larger semiconductor element 200 are shown as attached through supporting structures 206 to corresponding portions of a lid element 204 which includes lids 104. At this preliminary stage, semiconductor chips 100 are joined together at boundaries such as the boundary defined by dicing lane 208.

Figure 5B:
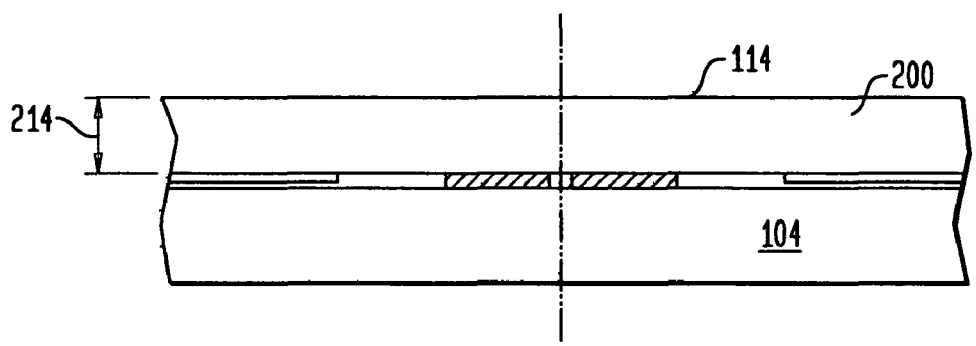

In a subsequent stage of fabrication illustrated in FIG. 5B, the semiconductor element 200 is shown inverted in relation to the view shown in FIG. 5A. As shown in FIG. 5B, a thickness of the semiconductor element 200 has been reduced, as by grinding and/or lapping from a rear face 114 thereof. Reducing the thickness of the semiconductor element 200 can assist in achieving a final packaged chip having a desirably small thickness 214. The lid element 104 overlying the front face of the semiconductor chip assists in providing structural support to the semiconductor chip, increasing its rigidity to permit the thickness of the packaged chip to be reduced as desirable to a smaller thickness.

Figure 6:
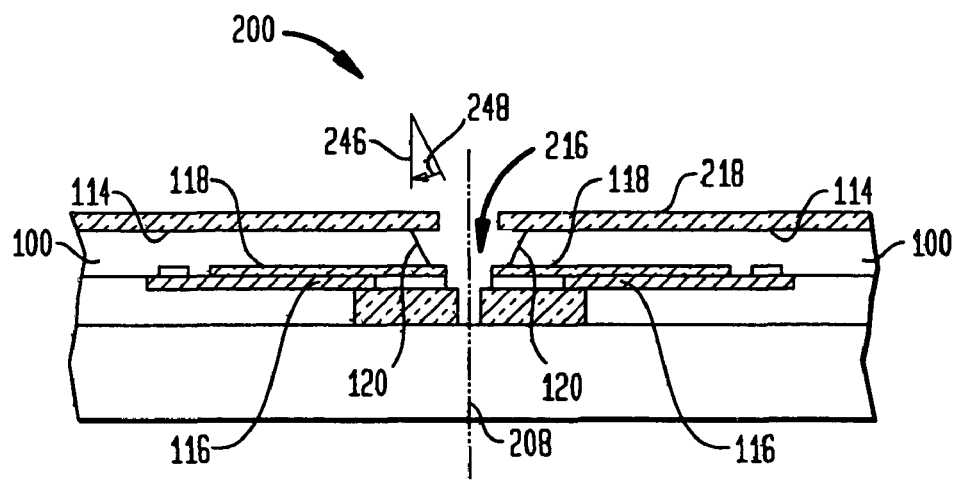

Thereafter, a subsequent stage of fabrication is shown in FIG. 6 in which an opening 216 is formed the semiconductor element 200 in registration with the dicing lane 208 between adjacent semiconductor chips 100. Openings preferably are formed which extend along the length of each edge 120 of each semiconductor chip as viewed in FIG. 3. Openings like the opening 216 shown in FIG. 6 preferably are formed by depositing a photoimageable layer 218, e.g., a photoresist, antireflective coating or other layer, patterning openings in the photoimageable layer by photolithography and then etching the semiconductor element from the rear face 114 in accordance the openings therein. The edges 120 of each chip 100 which are exposed at the walls of the openings preferably are oriented preferably at an angle 248 of between about 10 and 60 degrees from a normal 246 to the front face of the semiconductor chip. Preferably, the semiconductor element is etched isotropically using an etchant which attacks the semiconductor material, e.g. silicon, of the semiconductor element but which does not attack a material included in the passivation layer 118. In this way, the passivation layer functions as an etch stop protecting the front contact pads 116 when openings in the semiconductor element 200 are etched.

Figure 7:
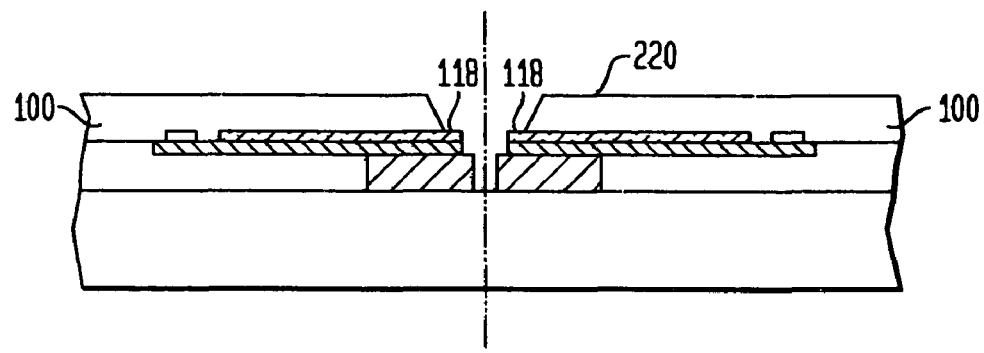

Referring to FIG. 7, after the openings are formed in the semiconductor element, the patterned photoimageable layer is removed from the assembly. At that time, the assembly appears as shown in FIG. 3, having semiconductor material portions removed where they overlie the front contact pads 116. For ease of illustration, the passivation layer overlying the contact pads 116 is not shown in FIG. 3. The assembly including the semiconductor element with the lid element attached thereto is then immersed in a dielectric deposition bath. The assembly is then held there under appropriate conditions for a sufficient time to form an electrodeposited conformal dielectric coating 220 on exposed exterior conductive and/or semiconductive surfaces of the semiconductor element. Preferably, an electrophoretic deposition technique is utilized to form the conformal dielectric coating, such that the conformal dielectric coating is only deposited onto the exposed conductive and/or semiconductive surfaces of the assembly. The electrophoretically deposited coating is self-limiting in that after it reaches a certain thickness governed by parameters, e.g., voltage, concentration, etc. of its deposition, deposition stops. Electrophoretic deposition forms a continuous and uniformly thick conformal coating where on conductive and/or semiconductive exterior surfaces of the assembly. In addition, the electrophoretically deposited coating preferably does not form on the passivation layer 118, due to its dielectric (nonconductive) property.

Preferably, the conformal coating is formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| | ECOAT NAME | | |
|---|---|---|---|
| | POWERCRON 645 | POWERCRON 648 | CATHOGUARD 325 |
| | MANUFACTURERS | | |
| MFG | PPG | PPG | BASF |
| TYPE | CATHODIC | CATHODIC | CATHODIC |
| POLYMER BASE | EPOXY | EPOXY | EPOXY |

TABLE 1-continued

| LOCATION | Pittsburgh, PA | Pittsburgh, PA | Southfield, MI |
|---|---|---|---|
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | | | |
|---|---|---|---|
| | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

Figure 8:
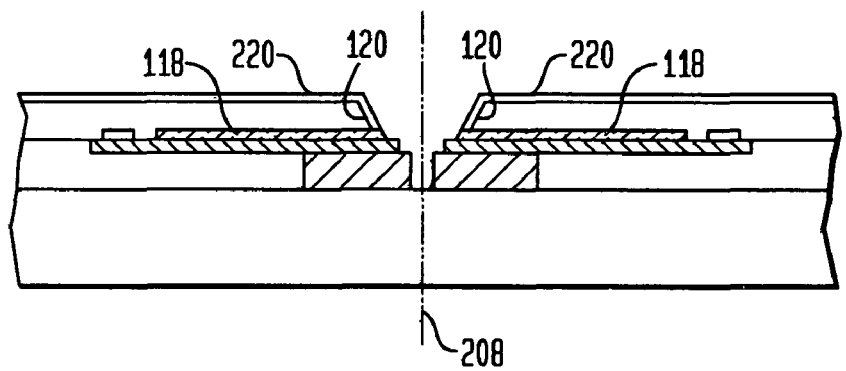

After electrophoretically depositing the conformal dielectric coating, processing is then begun for forming conductive traces which connect the front contact pads of the semiconductor chips to exterior contacts of the packaged chips. As illustrated in FIG. 8, portions of the dielectric passivation layer 118 extending beyond the conformal dielectric coating 220 at edges 120 of the semiconductor chips is now removed. Removal of the passivation layer can be performed, for example, through use of an etchant which attacks the passivation layer 118 while not substantially attacking the conductive material, e.g., one or more metals which are included in the front contact pads. An exemplary process for etching the passivation layer includes plasma etching performed in a manner which selectively does not attack organic materials so as to preserve the exposed conformal dielectric coating 220. Following the removal of the passivation layer overlying the front contact pads, optionally a groove is cut between the standoff structures on each side of the dicing lane, such as through use of a saw designed to make a "V"-shaped groove several microns in width. This process exposes conductive edges of the front contact pads along walls of the V-shaped groove.

Figure 9:
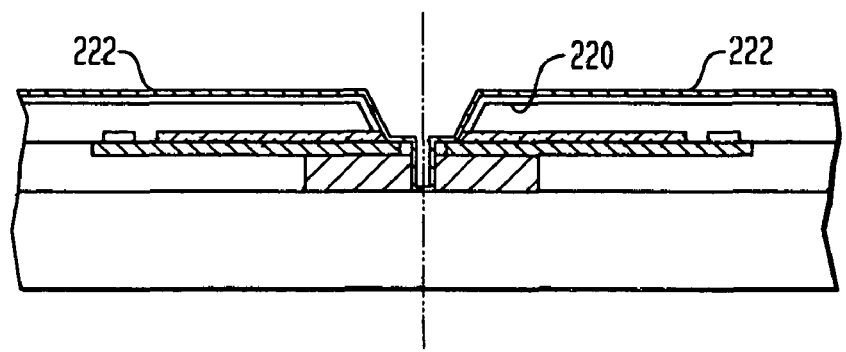

Thereafter, as illustrated in FIG. 9, a metal layer 222 for forming conductive traces is deposited to overlie the conformal dielectric coating 220. The metal layer preferably is deposited by sputtering a primary metal layer onto exposed surfaces of the assembly, or by electroless deposition. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the primary metal layer.

Figure 10:
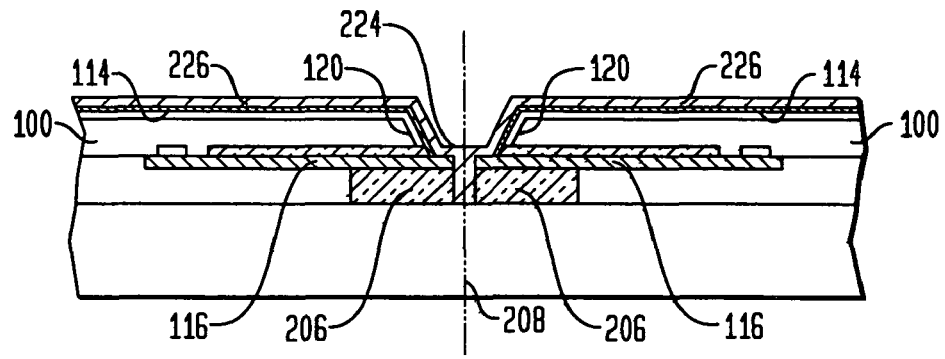

Subsequently, with reference to FIG. 10, a photoimageable layer is deposited to overlie the primary metal layer and a three-dimensional photolithographic patterning process is utilized to pattern the primary metal layer, such as the process described in U.S. Pat. No. 5,716,759 to Badehi, the disclosure of which is hereby incorporated by reference herein. Thereafter, remaining portions of the photoimageable layer are removed. As a result, individual conductive patterns are formed which correspond to the dimensions of conductive traces to be formed thereon. Following patterning of the primary metal layer into individual lines, the photoimageable layer is removed from the semiconductor element and an electroplating process is used to plate a secondary metal layer onto the primary metal layer to form individual conductive traces 226 extending from the front contact pads 116 along edges 120 and onto the rear faces 114 of the semiconductor chips. The secondary metal may include nickel or other noble metal. In one embodiment, the electroplated second metal on the primary metal layer completes the conductive traces. Alternatively, an optional third metal layer such as gold, platinum or palladium may be plated onto the secondary metal for providing corrosion resistance to complete the conductive traces. During the electroplating process, a plug 224 including the second metal layer and optional third metal layer forms overlying exposed surfaces of the front contact pads 116 and which may line or fill the gap between adjacent standoff structures 206.

Figure 11:
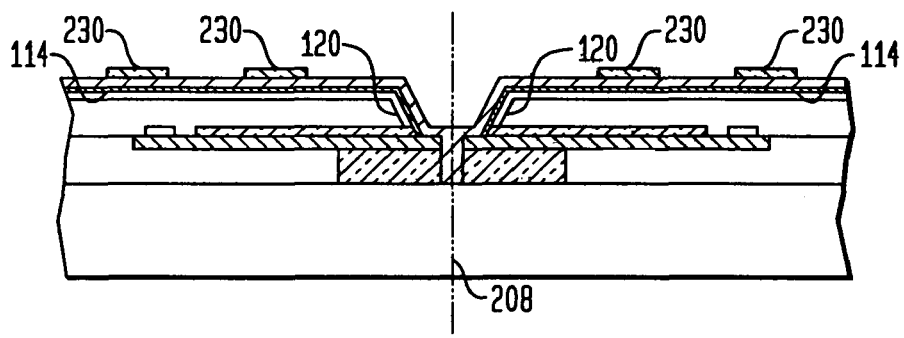

Subsequently, as illustrated in FIGS. 11-14, further processing is performed to define package contacts overlying the rear face 114 of the semiconductor chips. As illustrated in FIG. 11, an additional photoimageable layer 230 is deposited and patterned to cover portions of the conductive traces 226 where wettable metal contacts and preferably conductive bumps are to be formed.

Figure 12:
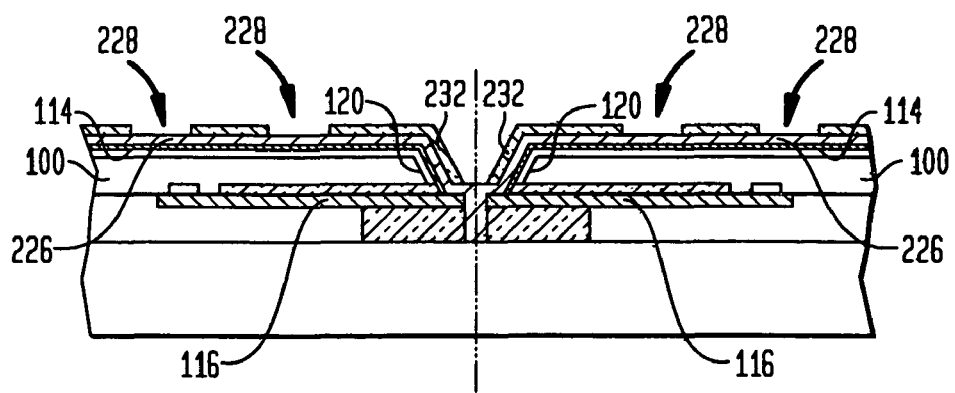

Referring to FIG. 12, a further process is performed to passivate exterior surfaces of the packaged chips. Preferably, a further electrophoretic process is employed to form a third insulative layer including uniformly thick conformal dielectric coating 232 overlying each of the conductive traces 226 on the rear surface 114 and edges 120. During that process, the metal plugs 224 provide conductive continuity between semiconductor chips 100 of the semiconductor element. Thereafter, the photoimageable layer 230 is removed by selective removal process, such as dissolution in a solvent or selective etching. FIG. 12 illustrates a particular stage in processing after the external conformal dielectric coating 232 has been formed and the patterned photoimageable layer has been subsequently removed, leaving openings 228 in the external passivating layer 232.

Alternatively, instead of depositing the conformal dielectric coating 232 by electrophoretic deposition as described with reference to FIGS. 11 and 12, the conformal dielectric coating 232 can be formed by spin-coating and/or spray coating a photoimageable dielectric such as an encapsulant towards the rear face and edges 120 of the semiconductor chip to form a relatively uniformly thick coating. Thereafter, openings 228 are formed in the conformal dielectric coating 232 by photolithographic process. One or more processes, e.g., heating etc. may be performed to cause the conformal dielectric coating 232 to harden after the initial deposition of the photoimageable material.

Figure 13:
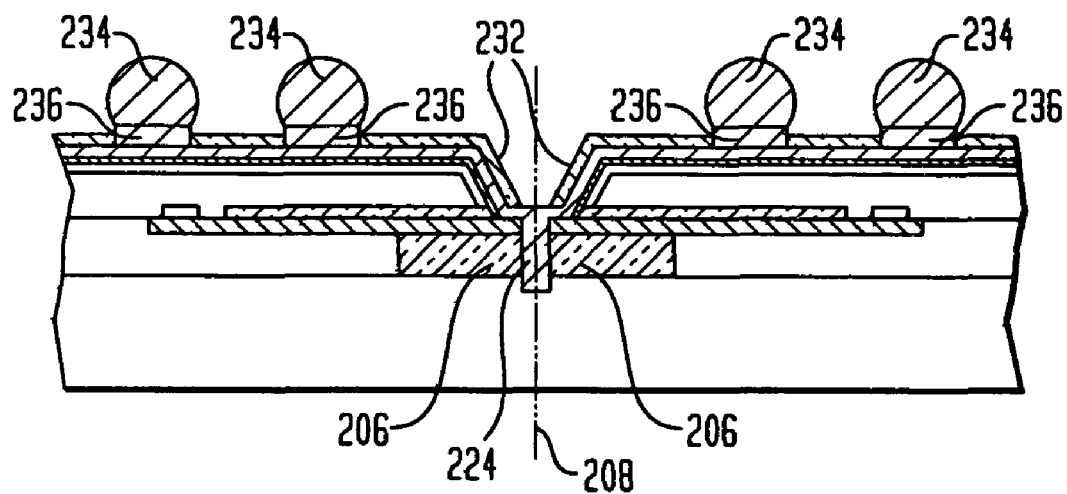

Subsequently, as illustrated in FIG. 13, conductive structures 236 including a wettable metal layer are formed within the openings of the passivating layer 232. For example, wettable metal features 236 of the type commonly referred to as "under bump metallization" ("UBM") are formed within the openings to overlie the conductive traces 226.

Thereafter, as further illustrated in FIG. 13, conductive bumps 234 are joined to the wettable metal features 236. As described above with reference to FIG. 1, the conductive bumps can include one or more conductive materials. For example, the conductive bumps can include a fusible metal such as solder, tin, or a eutectic composition and/or one or more noble metals, for example, copper, nickel, etc. In a preferred embodiment, the conductive bumps are formed by placing spheres including a fusible metal such as solder, tin or eutectic onto the wettable metal features 236 and then heating the conductive bumps thereto to fuse them to the wettable metal features 236.

Figure 14:
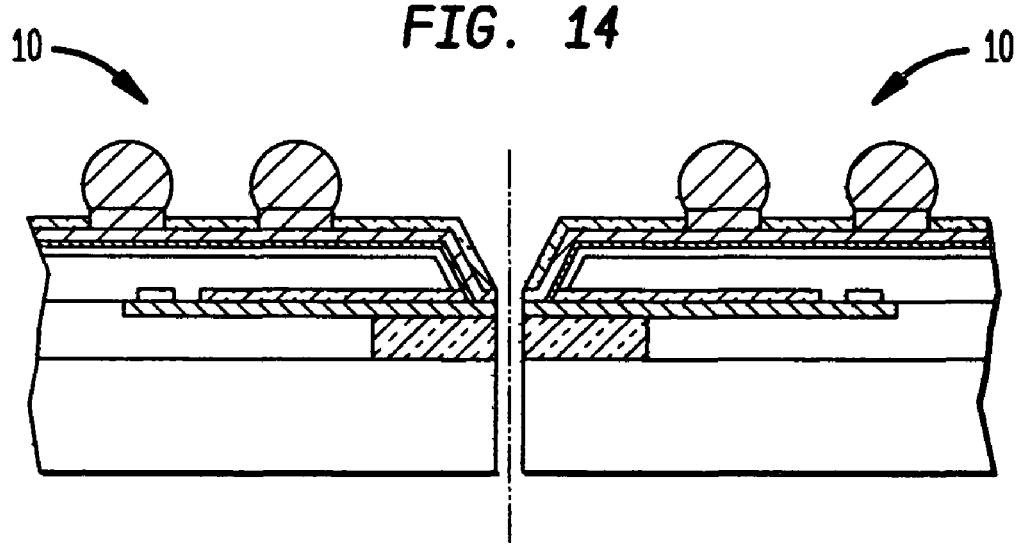

Finally, the packaged chips are severed from each other along dicing lane 208 by sawing or other dicing method to form individual packaged chips as illustrated in FIG. 14. A variety of exemplary processes for severing packaged chips into individual units are described in the herein incorporated commonly owned U.S. Provisional Application Nos. 60/761, 171 and 60/775,086, any of which can be used to sever the packaged chips to form individual packaged chips as shown in FIG. 14. During the process used to sever the assembly into individual packaged chips 10 (FIG. 14), metal features 224 disposed between the front contact pads preferably are removed, such that individual ones of the front contact pads 116 on the semiconductor chips are conductively disconnected from each other.

Figure 19A:
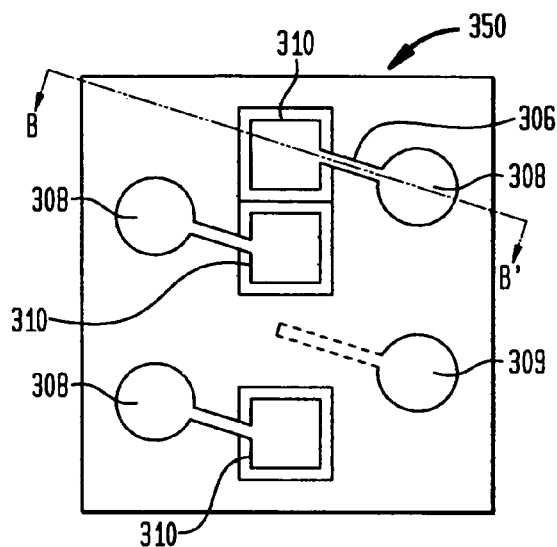
Figure 19B:
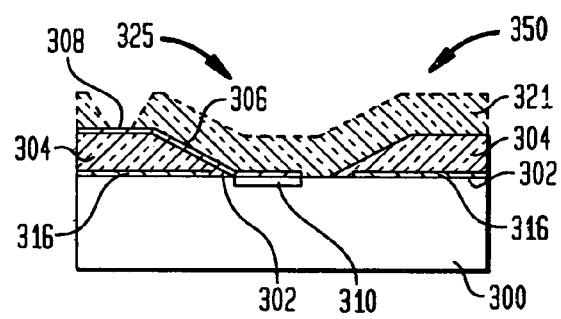

Referring now to FIGS. 19A-19B, in a microelectronic structure 350 according to another embodiment of the invention, conductive features 310 at a front face 302 of a semiconductor chip 300 are covered with a dielectric material 304 by an electrophoretic deposition process. The electrophoretically deposited dielectric coating 304 serves as a dielectric level on which conductive traces 306 and additional conductive contacts 308 can be disposed above the front face 302 of the chip. As the traces 306 and additional contacts 308 are in conductive communication with original contacts 310 of the chip, the conductive traces 306 and additional conductive contacts 308 serve to redistribute the conductive contacts from the original contacts 310 of the chip.

In the microelectronic structure 350 illustrated in FIGS. 19A-19B, the conductive trace 306 has an advantageous microstrip line relationship with the conductive feature 316 on which the electrophoretic coating 304 is formed. In a microstrip line, a uniformly thick dielectric layer separates a signal-carrying conductor from another conductor, e.g., ground plane which is held at a reference potential such as ground or other typically fixed potential. In one example, the signal-carrying conductor includes trace 306 and contact pad 308, and the other conductor 316 at the front face 302 of the chip is held at fixed potential such as ground. Openings 325 in the electrophoretic coating 304 can be provided selectively, such that only certain contacts 310 of the chip are connected to conductive traces 306 and conductive pads 308 of the chip for redistribution. Other contacts of the chip can be connected to the ground plane or reference conductor 316 at the front face of the chip.

Figure 15A:
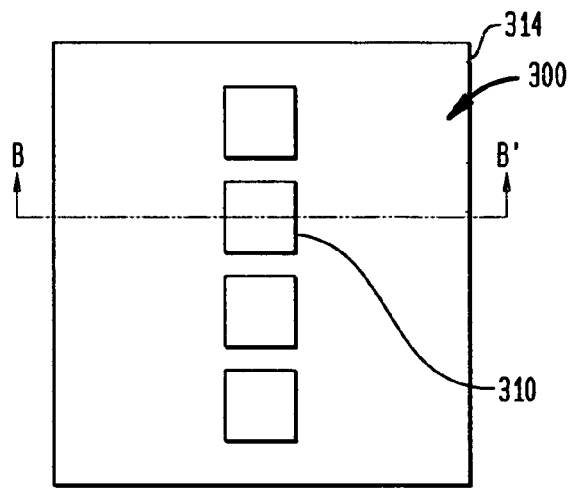
Figure 15B:
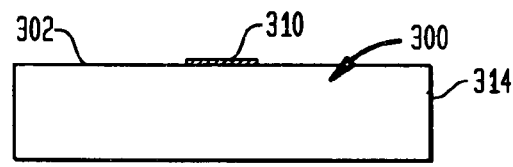

A method of fabricating the microelectronic structure illustrated in FIGS. 19A-19B will now be described with reference to FIGS. 15A through 18B. FIGS. 15A and 15B illustrate a preliminary stage in the formation of the microelectronic structure 350. As shown therein, a plurality of exposed conductive contacts 310 are provided at the front face 302 of a microelectronic chip such as a semiconductor chip having active devices therein. A dielectric layer is provided in areas of the front face other than where the conductive contacts are exposed, such dielectric layer usually being referred to as a "passivation layer." The conductive contacts 310 of the chip are shown arranged in a row. However, the contacts 310 need not be arranged in one line. The contacts 310 can be disposed at or near peripheral edges 314 of the chip or the contacts 310 can be disposed at locations farther away, or even well removed from the edges 314.

Figure 16A:
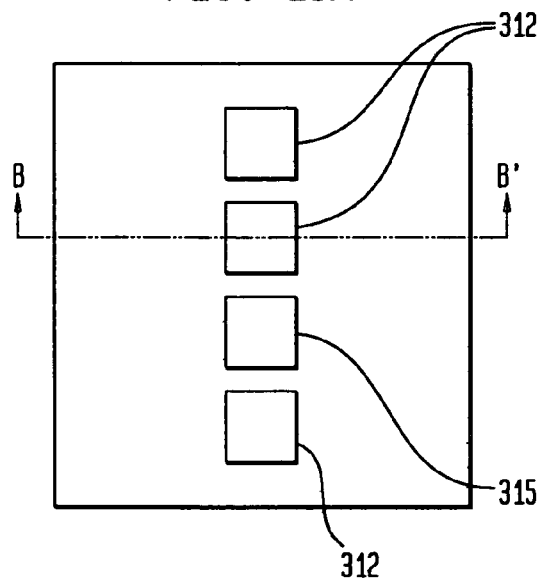
Figure 16B:
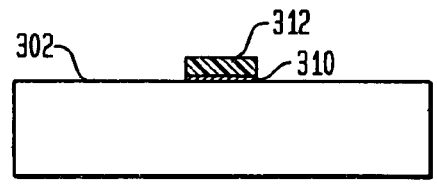

Preferably, the processing described herein for fabricating the structure shown in FIGS. 19A-19B is performed simultaneously to a plurality of chips while the chips remain attached together in form of a wafer or portion of a wafer. As illustrated in FIGS. 16A and 16B, in a step prior to forming the electrophoretic coating, a masking layer 312 is formed in registration with at least some of the contacts 310 to prevent the electrophoretic coating from being formed thereon. Preferably, an inorganic dielectric material such as an oxide of silicon having a thickness of 10 μm (microns) or greater is blanket-deposited to overlie the front face 302 of the chip. Thereafter, the layer of inorganic dielectric material is removed in areas except where the inorganic dielectric material overlies certain ones of the contacts 310. In this way, the inorganic dielectric layer remains as a masking layer over some, but not all of the contacts 310. For example, as shown in FIG. 16A, a particular contact 315 remains uncovered by the masking layer 312.

In a subsequent stage of fabrication illustrated in FIGS. 17A and 17B, a metal layer 316 is blanket deposited to overlie the front face 302 of the chip. Thereafter, the masking layer 312 (FIGS. 16A-16B) is removed from the contacts 310, leaving the previously masked contacts exposed once again. However, the blanket deposited metal layer is formed in conductive communication with the particular contact 315 that was not masked by masking layer 312. As will be described below, the blanket metal layer 316 is typically used for the purpose of a ground plane. Therefore, the particular contact 315 will be conductively connected to the blanket deposited metal layer when other contacts 310 are exposed after removal of the masking layer 312.

Thereafter, with reference to FIGS. 18A-18B, an electrophoretic deposition process is utilized to apply a dielectric coating 304 on the metal layer 316. The dielectric coating 304 has a thickness of between about one μm (micron) and 100 μm, and preferably between about one μm and 15 μm. The dielectric layer 304 has a substantially flat top surface 320 and typically has a gradual, sloping transition 305 between the front face 302 of the chip 300 and the top surface 320. This transition 305 may follow a line of curvature from the substantially flat top surface 320 or may simply be canted at an angle such that the transition 305 is not too vertically oriented in relation to the front face 302 and the top surface 320.

The electrophoretically deposited layer 304 preferably includes a low modulus of elasticity material, such as may be obtained by electrophoretic deposition of polymeric materials such as flexibilized epoxy, silicones, acrylics, etc. Alternatively, a flexible electrophoretic coating, capable of buckling or wrinkling to accommodate relative movement, can be fabricated from high elastic modulus materials, normally considered as "rigid," provided that these materials are present in thin layers. Relatively soft materials can be used in greater thicknesses and provide a highly flexible coating. Such soft materials provide a highly compliant interposer or underlayer for the placement of conductive contacts thereon, i.e., an interposer which is readily compressible in the directions perpendicular its surfaces and which, therefore, permits movement of the terminals in these directions.

An advantage of forming the dielectric coating by electrophoretic deposition is that deposition occurs in response to application of an electric field. Accordingly, conditions are most favorable for deposition in areas where a conductor is exposed and is held at a certain potential in relation to the fluid deposition medium. In other areas where no exposed conductor is present and where the electric field is much weaker, deposition is minimal or non-existent. For this reason, the electrophoretic coating does not form on conductors which are not conductively connected to the required source of electric potential, even when such conductors are exposed directly to the deposition medium. In this way, contact pads 310 which are not conductively connected to the metal layer 316 remain free or substantially free of the deposited coating after the electrophoretic deposition process.

One characteristic of electrophoretic deposition is that the thickness of the resulting dielectric layer varies in relation to the strength of the electric field. For this reason, as illustrated in FIGS. 18A and 18B, the thickness 322 of the electrophoretically deposited dielectric layer 304 generally is constant over interior portions 320 of a conductive planar surface such as the ground plane 316. On the other hand, the thickness of the electrophoretically deposited dielectric layer 304 decreases gradually from its nominal thickness 322 to zero at boundaries of the conductive surface, i.e., at edges of the conductive surface. The resulting dielectric layer has a sloped edge, rather than an abrupt edge.

As shown in FIG. 18B, typically, the electrophoretic dielectric coating 304 extends somewhat beyond the edges 324 of the conductive surface. In this way, the dielectric coating 304 overlies portions 326 of the front face 302 of the chip adjacent to edges 324, but tapers off to zero thickness to leave contacts 310 exposed.

Thereafter, in the subsequent stage of fabrication shown in FIGS. 19A-19B, conductive traces 306 are formed which extend along the top surface of the dielectric and down the sloped edges to conductively connect to the original conductive contacts 310 of the chip 300. The sloping edges of the dielectric layer 334 enable conductive traces 306 to be provided which are subject to substantially less fatigue from thermal and mechanical stresses than would be the case if the edges of the dielectric layer 304 were at right angles to its top and bottom surfaces.

Simultaneously, outer conductive contacts 308, e.g., lands, are formed together with the conductive traces 306 in locations overlying an exposed surface of the dielectric coating 304. The fabrication of these additional lands 308 and traces 306 can be performed by processing as described above with reference to FIGS. 9 through 12. Further processing similar to that described with reference to FIGS. 13-14 above can be performed to fabricate ball grid array ("BGA") contacts and to sever individual chips from a larger assembly, e.g., semiconductor wafer or portion of semiconductor wafer. In a particular embodiment, a solder mask or other type of external passivation layer 321 can be formed, electrically isolating the original chip contacts 310, while leaving the contacts 308 exposed as lands or bond pads for the interconnection of bond wires thereto.

Figure 20A:
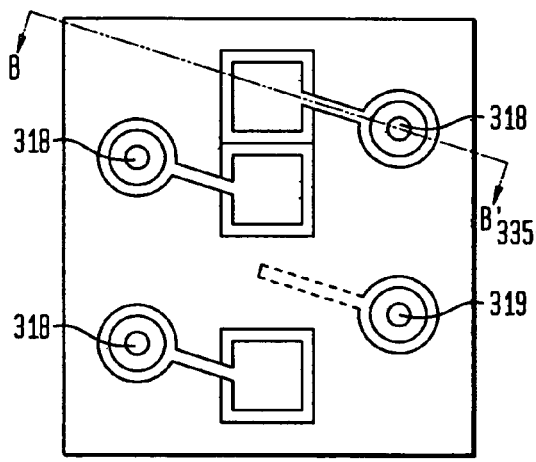
FIGS. 20A and 20B are a plan view and corresponding sectional view illustrating a packaged chip in accordance with a variation of the embodiment of the invention illustrated in FIGS. 19A-19B.
Figure 20B:
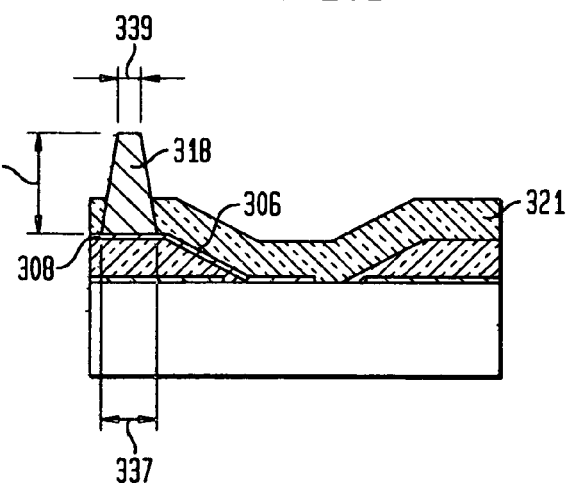

FIGS. 20A-20B illustrate a variation of the embodiment shown and described with reference to FIGS. 19A-19B above. As illustrated therein, a plurality of post-like or pin-like contacts 318 project upwardly from contact pads 308 overlying the electrophoretically deposited dielectric layer. Preferably, the contacts 318 are solid metal features and have frustum, conical or pyramidal shape. In one embodiment, the contacts 318 extend to a height 335 of about 100 μm above the surface of the contact pad 308, have a diameter at a base surface of about 200 μm, and have a diameter at a top surface or "tip" of about 50 μm.

Preferably, the contacts consist essentially of a metal such as copper or other metal which has a melting temperature higher than that of a fusible metal, e.g., solder. In that way, contacts 318 remain solid during processes used to bond the contacts 318 of the chip to other microelectronic structures as a chip carrier, interposer, circuit panel or the like. In one example, the contacts 318 can be fabricated through an additive process such as electroplating, or via transfer from an adhesively backed article and metallurgical bonding the contacts 318 to the contact pads. Alternatively, the contacts 318 can be fabricated via subtractive processing such as etching from a metal layer in accordance with a mask pattern. As further shown in FIGS. 20A-20B, an additional dielectric layer 321 overlies the surface of the conductive traces 306 and contact pads 308 as an external passivation layer or solder mask.

Figure 21A:
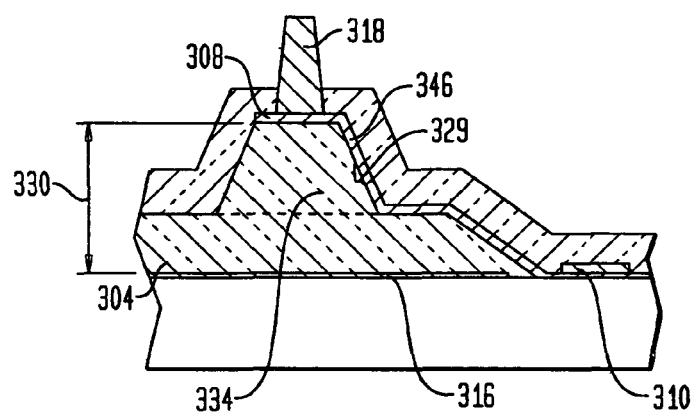
FIG. 21A is a sectional view illustrating a packaged chip in accordance with another embodiment of the invention.

In the embodiment of the invention illustrated in FIGS. 20A-20B, the thickness of the electrophoretically deposited dielectric layer 304 is constrained by the thermal-mechanical properties of the semiconductor wafer, e.g., silicon wafer and those of the dielectric layer. Even when the modulus of the dielectric layer 304 is quite low, the product of the thickness, the modulus and the mismatch between the thermal expansion coefficients of the two materials can cause the wafer to warp or bow under a relatively large change in temperature when the thickness of the dielectric layer is sufficient. Any warping of the semiconductor wafer is problematic because equipment and facilities are designed to process semiconductor wafers which are planar or have nearly perfect planarity. In addition, thermal expansion mismatch may cause the contacts 308 thereon to expand or shrink out of alignment with contacts of an external microelectronic element with which they mate. FIG. 21A illustrates a further variation of the above-described embodiment of the invention in which the thickness of the dielectric layer is made greater in locations where the dielectric is disposed between the conductive plane and individual external contact pads 308. Increasing the thickness of the dielectric layer in such locations allows the external contact pads 308 to be placed at greater height above front surface while keeping stresses due to thermal expansion mismatch at a manageable magnitude.

In this embodiment, the dielectric layer includes an initial dielectric layer 304 which is electrophoretically deposited as described above. After forming that layer 304, a region 334 of additional compatible dielectric material is formed in specific locations overlying the dielectric layer 304. In such way, dielectric region 334 and dielectric layer 304 together form a combined region of dielectric material between the contact pad 308 and the conductive plane 316, the combined region having a thickness 330 from the conductive plane 316 which is greater than that of the original dielectric layer.

In an alternative embodiment, the additional region 334 includes a different material than that of the electrophoretically deposited dielectric layer 304. Preferably, the additional region 334 has a lower modulus than that of the electrophoretic dielectric layer 304. In this way, the increased thickness of the combination of the additional region with the electrophoretic dielectric layer 304 provide a higher degree of compliancy than either layer provides by itself. As an example of use, one or both of the dielectric layer 304 and the additional region 334 are relatively compliant, i.e., have relatively low modulus and sufficient thickness. In such case, when a contact 318 overlying the additional region 334 is brought into mating contact with a terminal of an external element (not shown), the compliant material below the base of the contact 318 can flex. This permits the tip of the contact 318 to remain in mating contact with the terminal of the external element even when the mating surfaces of contacts and the external terminals are not perfectly planar.

Figure 21B:
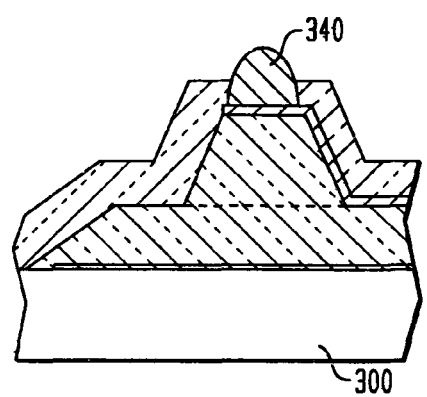
FIG. 21B is a sectional view illustrating a packaged chip in accordance with a variation of the embodiment of the invention illustrated in FIG. 21A.

FIG. 21B is a sectional view illustrating a microelectronic structure in accordance with a variation of the embodiment depicted in FIG. 21A. In this case, the contact includes a bump 340 including a fusible metal such as solder, tin or eutectic composition, instead of a post-like protrusion 318 (FIG. 21A). Alternatively, the bump 340 can include a solid or hollow core and a coating of such fusible material, the core containing one or more other materials such as copper or a polymer. Preferably, the bump 340 is arranged as one of many bumps overlying similar raised regions 334 of dielectric material in an arrangement referred to as a "ball grid array" (BGA).

Figure 22:
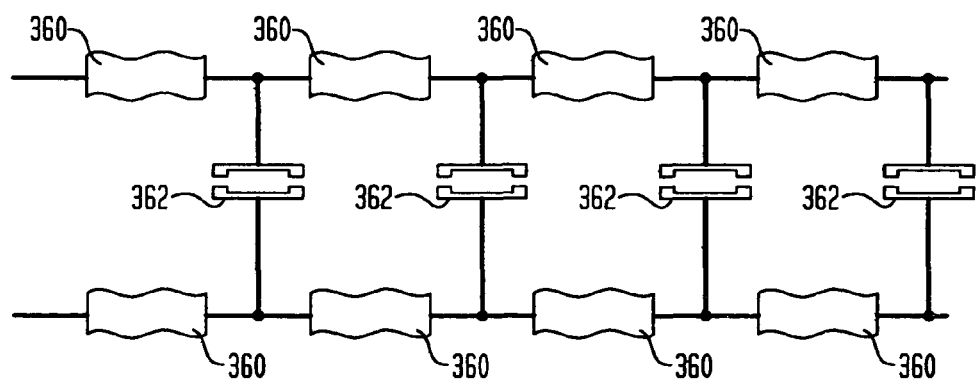
FIG. 22 is a schematic diagram illustrating a distribution of capacitance and inductance along wiring elements of a packaged chip.

FIG. 22 is a diagram of a network which models the electrical impedance characteristics of the structure illustrated in FIG. 21A. As illustrated in FIG. 21A, inductance and capacitance in the network is distributed, as modeled by inductors 360 and capacitors 362, which occur as parallel-disposed impedance elements in the network. To achieve good transmission of signals, capacitance and inductance are constant throughout the network.

The inductance and capacitance seen by each of the conductive traces 346 shown in FIGS. 21A-B varies with position along their lengths. The values of these parameters depend on the type of dielectric material in the dielectric regions 334, 304, as well as the thickness of the dielectric material from conductive plane 316 and the width of the conductive traces. The dielectric characteristics of regions 304, 334 are constant with position along the length of each trace. The width of each trace is also constant. For a variety of reasons, it is impractical for the widths of the traces 346 to vary between the original contacts 310 of the chip and the outer contacts 308. As a result, the increased thickness of the dielectric material directly underlying the contacts 318 causes the inductance and capacitance seen by the traces to vary along their length. Variations in impedance of this sort are problematic. Decreased tuning of the circuit and losses due to signal reflection can result.

Figure 23:
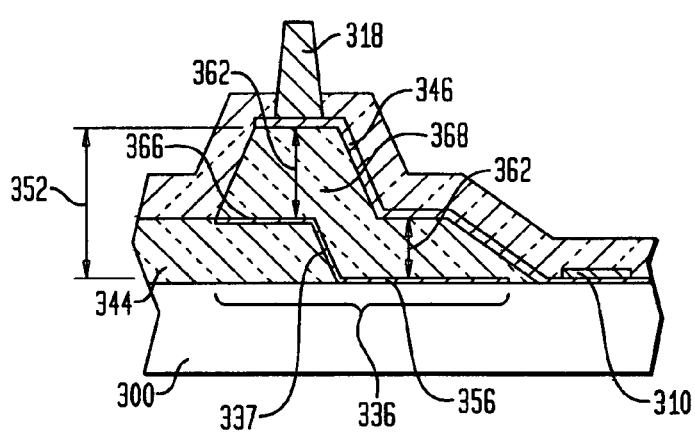
FIG. 23 is a sectional view illustrating a packaged chip in accordance with another embodiment of the invention in which each of a signal conductor and a reference conductor of a packaged chip follows a contour of an underlying exterior dielectric feature.

In a further variation of the above-described embodiment illustrated in FIG. 23, the aforementioned problems due to the non-uniform thickness of the dielectric layer 336 are addressed. Here, the surface of the lower conductor 336 is arranged such that it remains parallel to the external conductive traces 346 at a constant or near constant spacing thereto. In this case, a flat portion 356 of the lower conductor extends a distance along the front face of the chip. Then the lower conductor jogs upward along a wall portion 337 adjacent to a dielectric region 344. The wall portion 337 preferably is sloped such that the flat portion 356 is not at a right angle with the wall portion 337. Rather, the flat portion makes a gradual transition with the wall portion. An upper flat portion 366 also makes a gradual transition with the wall portion 337 at a location overlying dielectric region 344.

Fabrication of the microelectronic structure illustrated in FIG. 23 is similar to that of the structure shown in FIG. 21A. However, in this case, an additional dielectric region 344 is formed prior to forming the lower conductor and then forming the electrophoretically deposited dielectric coating 368 overlying the lower conductor 336. The substantially uniform thickness 362 of the dielectric coating 368 results from the electrophoretic deposition technique used to form the dielectric coating thereon. As mentioned above, electrophoretic deposition has a self-limiting quality such that its thickness is related to the strength of the electric field. Therefore, the electrophoretically deposited coating takes on the profile of the conductor which underlies the coating. For this reason, the conductive traces 346 of the resulting structure, shown in FIG. 23, remain at constant spacing to the lower conductor 336, to provide a transmission line having constant impedance.

Figure 24:
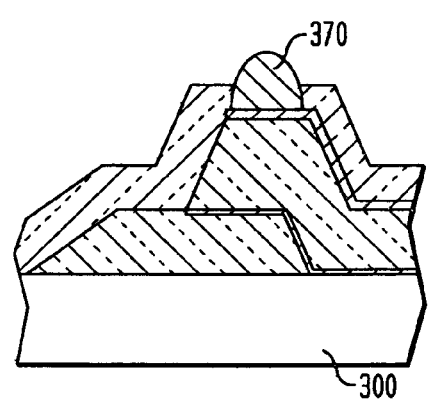
FIG. 24 is a sectional view illustrating a packaged chip in accordance with a variation of the embodiment of the invention illustrated in FIG. 23.

FIG. 24 illustrates a variation of the structure illustrated in FIG. 23, in which a conductive bump 370, rather than a post-like contact, is provided for externally connecting the chip to terminals of an external microelectronic element.

Figure 25:
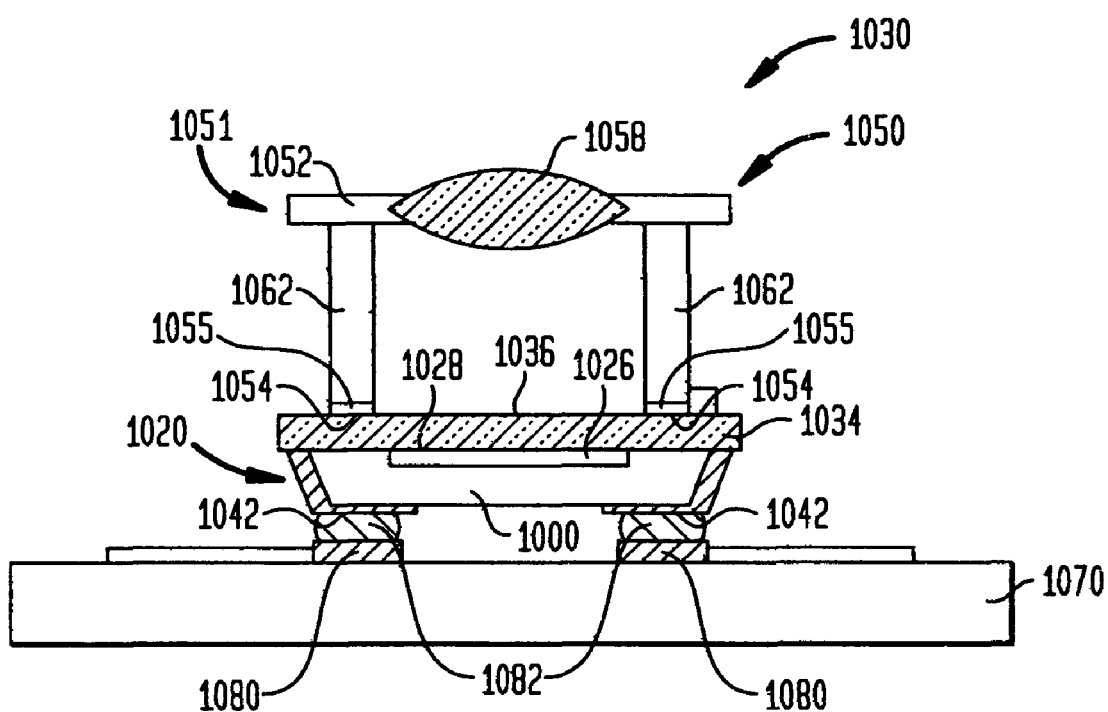
FIG. 25 is a sectional view illustrating a camera module in accordance with one embodiment of the invention in which a sensor unit has bottom contacts mounted to upwardly facing terminals on an upper surface of a circuit panel.

A camera module 1030 according to an embodiment of the invention (FIG. 25) includes a sensor unit 1020 having contacts 1042 disposed on the rear face of the sensor unit, i.e., on the surface of the semiconductor chip 1000 opposite from the front surface 1028 which carries the imaging area 1026. The sensor unit can be such as that shown and described above with reference to FIG. 1. Similar sensor units and camera modules are described in commonly owned U.S. patent application Ser. No. 11/265,727 filed Nov. 2, 2005 and Ser. No. 11/322,617 filed Dec. 30, 2005, the disclosures of which are hereby incorporated herein by reference. The contacts 1042 of the sensor unit are connected to terminals 1080 of a circuit panel 1070 by masses 1082 of fusible conductive material such as solder.

The optical unit 1050 in this arrangement includes a turret or support structure 1051 having a mounting portion 1052 arranged to hold one or more lenses or other optical elements 1058. The support structure 1051 also includes a plurality of rear elements 1062 in the form of elongated posts 1062 projecting rearward from the mounting portion 1052. These posts have rear surfaces 1054 which abut or mechanically engage a reference plane in the sensor unit to position the optical unit relative to the sensor unit. In the example illustrated in FIG. 25, the rear surfaces 1054 abut the front surface of the transparent cover 1034 which overlies the imaging area 1026. Alternatively, the turret or support structure includes registration features, e.g., posts, pins, recesses, or the like, for mechanically setting the height of the optical unit 1050 with respect to the chip 1000, while limiting tilt of the turret with respect to the imaging area 1026 of the chip.

It is desirable to make the connection between the rear surfaces of the posts 1062 and the front surface 1034 level and uniform in thickness. In another way to achieve this purpose, metallic attachment features or pads 1055 can be provided at the outer surface 1036 of the cover 1034, which are metallurgically bonded, e.g., via diffusion bonding, to metallic features at the rear surfaces 1054 of the posts 1062. Alternatively, a somewhat thin adhesive can be used to bond the rear surfaces of the posts to the cover.

In another embodiment, in place of posts, the turret or support structure 1051 includes a rear element which encloses or substantially encloses a volume having a cylindrical or polyhedral shape. Such rear element can be provided which has a cylindrical wall or polyhedral shaped (e.g., box-shaped) wall, in which the rear surface of the rear element abuts against a reference plane of the sensor unit such as provided at the outer surface 1036 of the cover 1034.

Figure 26:
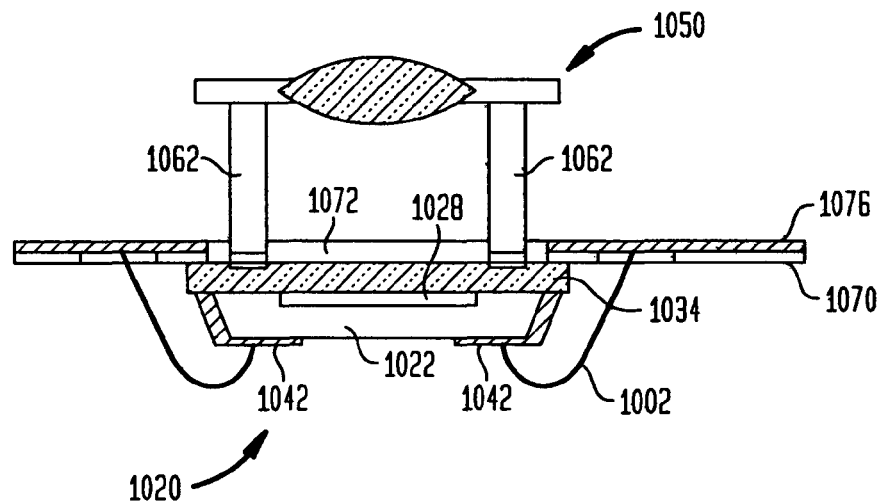
FIG. 26 is a sectional view illustrating a camera module in accordance with another embodiment of the invention which includes a sensor unit having a front face mounted to a lower surface of a circuit panel and an optical unit having rear elements extending through a hole in the circuit panel to abut or engage the sensor unit.

In a variation of the above embodiment shown in FIG. 26, sensor unit 1020 is mounted with the front of the sensor unit, and hence, imaging area 1028 facing forwardly, toward the rear or bottom surface of circuit panel 1070. The contacts 1042 of the sensor unit are connected by suitable leads or wire bonds 1002 to the conductors 1076 of the circuit panel. In this embodiment, the rear elements 1062 of the optical unit 1050 project through a hole 1072 in the circuit panel aligned with the imaging area 1028. Stated another way, hole 1072 is large enough to accommodate the light path from the optical element to the imaging area and also accommodate the rear elements 1062. A similar arrangement can be used with sensor units having contacts on the front face, as discussed above.

Figure 27:
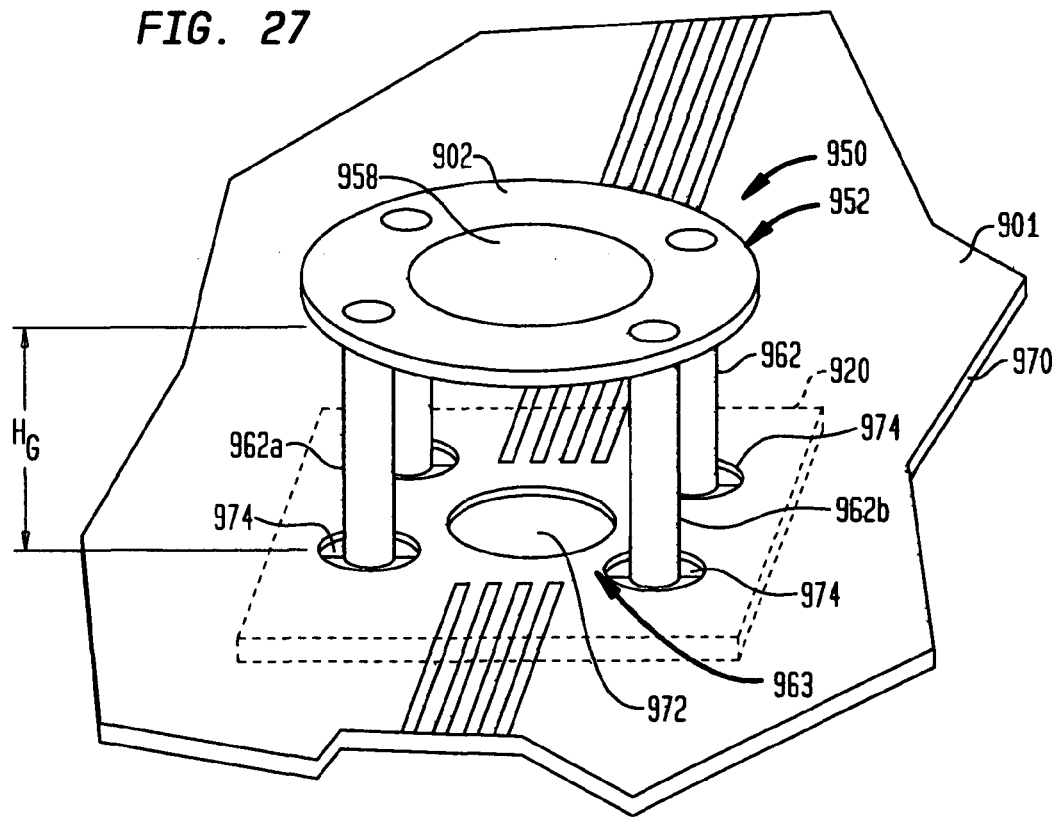
FIG. 27 is a perspective view illustrating a camera module in accordance with a variation of the embodiment illustrated in FIG. 26, in which each rear element extends through a separate hole in the circuit panel to contact a sensor unit.

A camera module in accordance with a further embodiment of the invention (FIG. 27) includes a sensor unit 920, depicted in broken lines, disposed on the bottom or rear side of a circuit panel 970. Here again, the imaging area of the chip in the sensor unit is aligned with a hole 972 in the circuit panel. The optical unit 950 in this arrangement includes a turret or support structure 952 having a mounting portion 902 arranged to hold one or more lenses or other optical elements 958. The support structure 952 also includes a plurality of rear elements 962 in the form of elongated posts projecting rearward from the mounting portion 902. These posts extend through apertures 974 in the circuit panel, and thus mechanically engage the sensor unit to position the optical unit relative to the sensor unit as discussed above. Here again, posts define gaps between them as, for example, gap 963a between posts 962a and 962b. Here again, the circuit panel 970 may extend into the gaps, and hence may extend between the sensor unit and optical unit, which facilitates making connections to the sensor unit as discussed above. In the embodiment of FIG. 27, the gaps have substantial height. The height $H_G$ of the gap in the completed assembly is equal to the height of the mounting element 902 above the front surface 901 of circuit panel 970. The height $H_G$ desirably is on the order of 2 mm or more, more desirably 5 mm or more, and most preferably 1 cm or more. The width of each gap (i.e., the horizontal distance, parallel to the circuit panel, between rear elements 962a and 962b) desirably also is at least about 2 mm, more desirably at least about 5 mm, and most desirably at least about 1 cm. As further discussed below, provision of such large gaps allows access into the area between the optical element and hole 972 for performing operations on the completed assembly. The large gaps, however, can be provided without increasing the overall height of the assembly. The distance between the optical elements such as lens 958 and the sensor unit is set by the optical properties of the system as, for example, the focal length of lens 958. Therefore, the lens must be supported at a substantial distance forward of the circuit panel in any event.

A module or assembly in accordance with the embodiment of FIG. 27 can be treated after assembly by performing operations on the sensor unit through the gap or gaps, and desirably also through hole 972 in the circuit panel. For example, the assembly may be subjected to a cleaning operation in which a cleaning fluid, a cleaning implement, or both are inserted into one or more of the gaps and through hole 972 to clean the surface of the sensor module. For example, where the sensor module incorporates a cover facing forwardly toward the rear or bottom surface of the circuit panel, the area of the cover aligned with the hole which includes the area aligned with the imaging area of the sensor chip can be cleaned. The ability to perform such a cleaning operation on the completed assembly counteracts the effects of contamination during the assembly process. This, in turn, can provide a higher quality camera unit, and also can allow some relaxation of the conditions applied during assembly to provide contamination. For example, a "clean room" environment may be unnecessary, or alternatively, a less expensive, lower-quality clean room may be used. In a further example, the sensor unit may not incorporate a separate cover, but instead may consist only of a "bare" semiconductor chip having an imaging area and having a passivation layer in the form of a thin coating effective to protect the elements of the bare chip from chemical or mechanical damage during the assembly process. Such a bare imaging chip typically requires very stringent precautions during handling to avoid deposition of dirt overlying one or more imaging elements. The requirements are somewhat less stringent for sensor units which incorporate a cover. However, by post-cleaning after assembly, the less stringent requirements may be applied to assembly of sensor units which do not include a cover.

In a method according to a further embodiment of the invention, the sensor unit may include a sacrificial layer overlying the front of the sensor unit as, for example, a sacrificial layer overlying the outer surface of the cover in a sensor unit which includes a cover, or a sacrificial layer overlying the imaging area of the chip in a sensor unit which does not include a cover. The assembly is fabricated with the sacrificial layer in place. The completed assembly is then subjected to an operation in which the sacrificial layer, or at least that portion of the sacrificial layer aligned with the imaging area of the sensor unit, is removed through hole 972 and through the one or more of the gaps 963 in the support structure 952. For example, the sacrificial layer may be removed by dissolving it, or by mechanically engaging it and peeling it away from the sensor unit. Removal of the sacrificial layer removes any contaminants which may have accumulated on that layer.

Other operations also may be performed through the gap or gaps. For example, a tool may be inserted into the gap or gaps to engage the conductors of the circuit panel and bond them to the contacts of the sensor unit. Alternatively, a wire-bonding tool may be used to provide wire bonds extending between the conductors and the sensor unit through hole 972, or through one or more of the additional apertures 974, or through other apertures (not shown) provided in the circuit panel for this purpose.

It is not essential to provide post-like rear elements in order to provide large gaps as discussed above. For example, the rear elements may be in the form of plates or ribs. Also, it is not essential to provide multiple gaps; only one gap may be sufficient for some operations.

Figure 28:
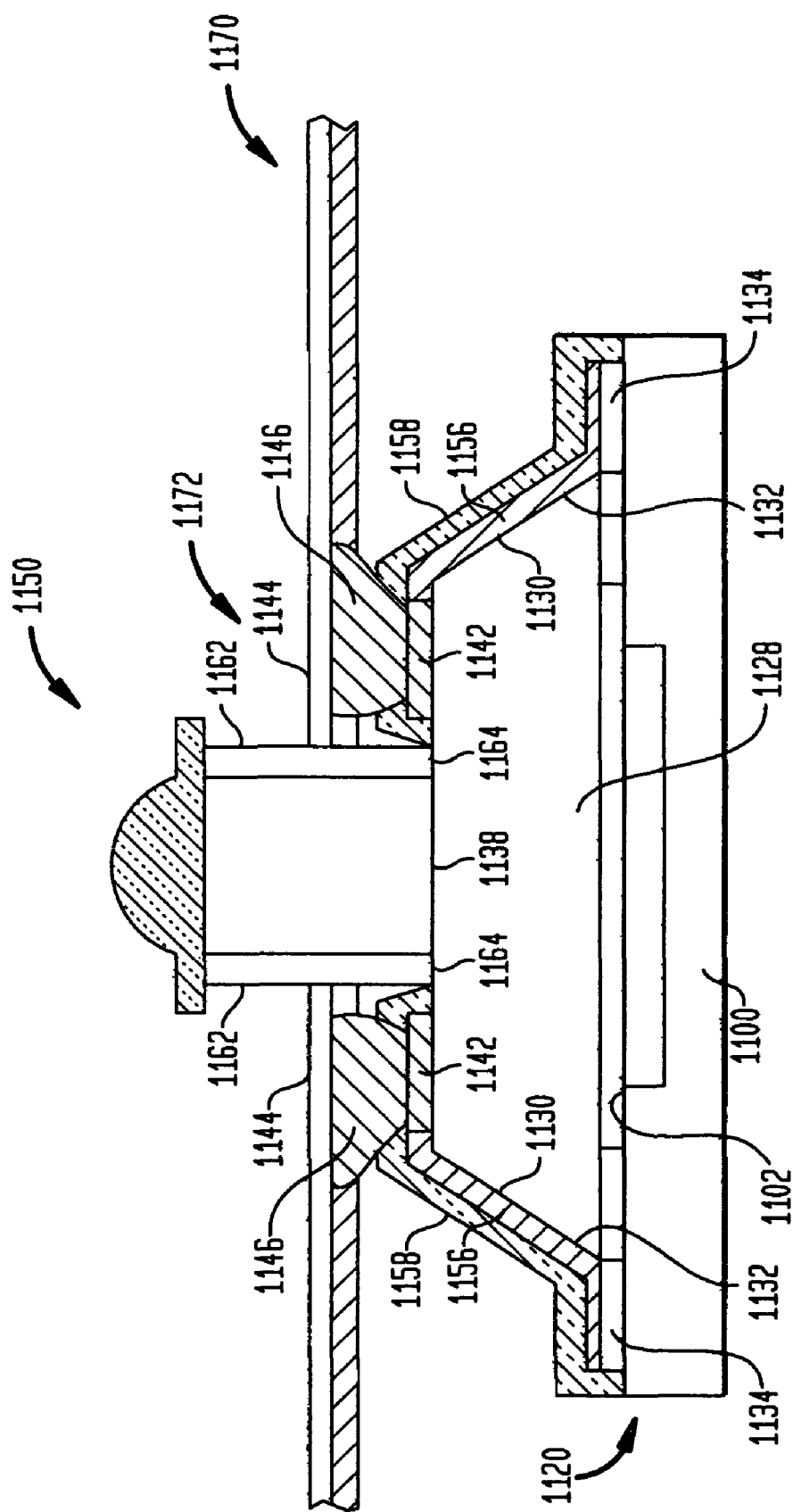
FIG. 28 is a sectional view illustrating a camera module in accordance with another embodiment of the invention in which contacts on a front face of the sensor unit are mounted to a lower surface of a circuit panel and an optical unit has rear elements extending through a hole in the circuit panel to abut or engage the sensor unit.

FIG. 28 illustrates an optical unit or camera module in accordance with another embodiment of the invention. In this embodiment, a sensor unit 1120 has contacts 1142 conductively connected to terminals 1144 of a circuit panel which overlies the outer surface 1138 of the cover 1128, e.g., via solder masses 1146. Walls 1130 of the cover are preferably sloped such that the radii at edges 1132 of the walls are gradual and preferably provide a smooth transition between a set of first contacts 1134 provided on the front surface 1102 of the chip and the walls 1130. A set of conductive traces 1156, formed by processes such as that described above (FIGS. 15A through 19B) extend from the first contacts 1134 along walls 1130 and onto the outer surface 1138 of cover 1128, these being conductively connected to contacts 1142. A dielectric coating 1158, such as an epoxy or other polymeric material deposited preferably via electrophoretic deposition, overlies the conductive traces 1156 and is utilized as a passivation layer, e.g., solder mask with openings exposed above the contacts 1142.

As in the example shown and described above with reference to FIG. 26, an optical unit 1150 has a set of rear elements 1162 which extend rearward from a structure supporting an optical element 1158, e.g., a lens or other optical device selected from, among others, refractive or diffractive elements, filters, reflectors and scatterers. Here again, rear surfaces 1164 of the rear element are adapted to extend through a hole 1172 in the circuit panel to abut or engage the outer surface 1138 of the cover 1128 or other reference plane of the sensor unit 1120.

In the embodiments discussed above, the circuit panel has a hole extending through the panel in alignment with the imaging area of the sensor unit. Such a hole forms a transparent region in the circuit panel. In other embodiments, the circuit panel includes a solid but transparent region in alignment with the imaging area of the sensor unit. For example, the circuit panel may be formed from a transparent dielectric material, in which case the transparent region of the circuit panel may be provided simply by routing the conductors of the circuit panel so that no conductors cross the transparent region.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, in a particular embodiment of the invention, conductive traces extend from conductive features at the front face of a semiconductor chip along edges of a lid or along walls of openings formed in a lid covering the semiconductor chip and onto an outer surface of the cover element.

The invention claimed is:

1. A method of fabricating a microelectronic unit, the method comprising:
    assembling a front face of a semiconductor chip with a cover element through a standoff structure disposed along the perimeter of the front face of the semiconductor chip to form a unit, the semiconductor chip including a rear face remote from the front face of the semiconductor chip, the unit having an exterior major surface parallel to the front face of the semiconductor chip and which includes at least a portion of the rear face of the semiconductor chip, the semiconductor chip including a plurality of semiconductor devices, a first insulative layer overlying the front face of the semiconductor chip, and a plurality of conductive features overlying the first insulative layer and being conductively connected to the plurality of semiconductor devices, the semiconductor chip including a plurality of transverse surfaces that extend from the exterior major surface of the unit and which coincide with a plurality of sloped edges of the semiconductor chip that extend from the perimeter of the rear face of the semiconductor chip toward the first insulative layer;
    electrodepositing a second insulative layer onto the plurality of sloped edges of the semiconductor chip and at least a portion of the exterior major surface; and
    forming a plurality of conductive traces onto the second insulative layer along portions of the plurality of sloped edges of the semiconductor chip and the exterior major surface, the plurality of conductive traces being connected to the end portions of the at least some of the plurality of conductive features.

2. The method as claimed in claim 1, wherein at least some of the plurality of transverse surfaces coincide with openings extending from the rear face of the semiconductor chip to the first insulative layer, and the second insulative layer is electrodeposited onto the rear face and the openings.

3. The method as claimed in claim 1, wherein the cover element has an outer surface remote from the front face of the semiconductor chip and the cover element includes a dielectric material exposed at the outer surface.

4. The method as claimed in claim 1, further comprising:
    electrodepositing a third insulative layer onto portions of the plurality of conductive traces; and
    forming a plurality of conductive contacts in openings in the third insulative layer overlying the plurality of conductive traces, the plurality of conductive traces conductively connecting the conductive contacts to the conductive features.

5. The method as claimed in claim 1, wherein at least some of the plurality of conductive features have respective end portions that extend outwardly from the sloped edges of the semiconductor chip.

6. A method of fabricating a microelectronic unit, the method comprising:
assembling a semiconductor element with a cover element to form a unit, the unit having an exterior major surface parallel to a front face of the semiconductor element, the semiconductor element including a plurality of semiconductor devices, a first insulative layer overlying the front face and a plurality of conductive features overlying the first insulative layer and conductively connected to the plurality of semiconductor devices, at least one of the semiconductor element or the cover element including transverse surfaces extending inwardly from the exterior major surface of the unit, wherein the semiconductor element includes a rear face remote from the front face and the exterior major surface of the unit includes at least a portion of the rear face of the semiconductor element;
electrodepositing a second insulative layer overlying the transverse surfaces and at least a portion of the exterior major surface; and
forming a plurality of conductive traces overlying the second insulative layer along portions of the transverse surfaces and the exterior major surface, the plurality of conductive traces being connected to the plurality of conductive features;
wherein the semiconductor element includes a plurality of chips joined together at a plurality of dicing lanes, wherein when the second insulative layer is deposited, at least some of the plurality of conductive features are disposed adjacent to each other across ones of the plurality of dicing lanes and the at least some conductive features are conductively connected to each other by conductive elements extending across the plurality of dicing lanes.

7. The method as claimed in claim 6, further comprising severing the plurality of chips along the plurality of dicing lanes.

8. A method of fabricating a microelectronic unit, the method comprising:
assembling a semiconductor element with a cover element to form a unit, the unit having an exterior major surface parallel to a front face of the semiconductor element, the semiconductor element including a plurality of semiconductor devices, a first insulative layer overlying the front face and a plurality of conductive features overlying the first insulative layer and conductively connected to the plurality of semiconductor devices, at least one of the semiconductor element or the cover element including transverse surfaces extending inwardly from the exterior major surface of the unit;
electrodepositing a second insulative layer overlying the transverse surfaces and at least a portion of the exterior major surface; and
forming a plurality of conductive traces overlying the second insulative layer along portions of the transverse surfaces and the exterior major surface, the plurality of conductive traces being connected to the plurality of conductive features;
wherein the semiconductor element includes a rear face remote from the front face and the exterior major surface of the unit includes at least a portion of the rear face of the semiconductor element, at least some of the plurality of transverse surfaces coincide with openings extending from the rear surface of the semiconductor element to the first insulative layer, and the second insulative layer is electrodeposited onto the rear face and the openings;
wherein the step of assembling the semiconductor element with the cover element is performed when the semiconductor element has an essentially continuous rear surface and the cover element has an essentially continuous outer surface, the method further comprising forming the plurality of openings by removing semiconductor material from the semiconductor element.

9. The method as claimed in claim 8, further comprising grinding the semiconductor element from the rear face to reduce the thickness of the semiconductor element prior to forming the plurality of openings.

10. The method as claimed in claim 8, wherein the plurality of openings are formed by etching the semiconductor element.

11. The method as claimed in claim 10, wherein the semiconductor element is etched by applying an etchant through openings in a mask layer, the etchant not attacking the first insulative layer during the etching of the semiconductor element.

12. The method as claimed in claim 11, further comprising extending the plurality of openings through the first insulative layer to expose at least some of the conductive features after the step of electrodepositing the second insulative layer.

13. The method as claimed in claim 12, wherein the step of forming the plurality of traces includes depositing a metal layer onto the at least some conductive features, and onto the second insulative layer overlying the openings in the semiconductor element and the rear face of the semiconductor element.

14. The method as claimed in claim 13, wherein the metal layer is deposited by sputtering.

15. The method as claimed in claim 13, wherein the metal layer is deposited by chemical vapor deposition ("CVD").

16. The method as claimed in claim 13, wherein the metal layer is deposited by a step of electroless plating followed by a step of electrolytic plating.

17. The method as claimed in claim 13, wherein the metal layer is conformally deposited to overlie at least the rear face and walls of the openings, the plurality of conductive traces include a plurality of first metal patterns photolithographically defined from the metal layer, and the step of forming the plurality of conductive traces further includes plating a second metal layer onto the plurality of first metal patterns.

18. The method as claimed in claim 13, wherein the metal layer is conformally deposited to overlie at least the rear face and walls of the openings, the step of forming the plurality of traces includes photolithographically defining first metal patterns from the metal layer, and plating a second metal layer onto the plurality of first metal patterns.

19. The method as claimed in claim 18, wherein the metal layer includes aluminum, the second metal layer includes nickel, and the metal layer is deposited by sputtering.

20. The method as claimed in claim 18, wherein the metal layer includes titanium, the second metal layer includes nickel, and the metal layer is deposited by sputtering.

21. The method as claimed in claim 20, further comprising plating a third metal layer to overlie the second metal layer, the third metal layer including copper.

22. The method as claimed in claim 13, further comprising applying a dielectric masking layer to overlie the plurality of conductive traces and rear surface, the masking layer having mask openings aligned with at least some of the plurality of conductive traces, and forming a plurality of external contacts within the mask openings, the plurality of external contacts conductively contacting the plurality of traces.

23. The method as claimed in claim 22, wherein the step of forming the plurality of external contacts includes plating a third metal layer onto the traces exposed within the openings in the masking layer.

24. The method as claimed in claim 22, wherein the step of forming the plurality of external contacts includes forming a plurality of metallic bumps.

25. The method as claimed in claim 1, wherein a step of electrodepositing a second insulative layer includes contacting an exterior surface of the unit with a fluid polymeric composition and applying a current through the fluid composition to electrophoretically deposit the second insulative layer.

26. The method as claimed in claim 25, wherein the fluid polymeric composition includes a cathodic epoxy composition.

27. The method as claimed in claim 26, wherein the fluid polymeric composition includes an anodic composition.

28. A method of fabricating a microelectronic unit, the method comprising:

assembling a semiconductor element with a cover element to form a unit, the unit having an exterior major surface parallel to a front face of the semiconductor element, the semiconductor element including a plurality of semiconductor devices, a first insulative layer overlying the front face and a plurality of conductive features overlying the first insulative layer and conductively connected to the plurality of semiconductor devices, at least one of the semiconductor element or the cover element including transverse surfaces extending inwardly from the exterior major surface of the unit, wherein the semiconductor element includes a rear face remote from the front face and the exterior major surface of the unit includes at least a portion of the rear face of the semiconductor element, wherein the semiconductor element includes an imaging area, the unit being assembled with an optical unit having an optical element in registration with the imaging area to form a camera module, the optical element being separated from the semiconductor element by the cover element;

electrodepositing a second insulative layer overlying the transverse surfaces and at least a portion of the exterior major surface; and forming a plurality of conductive traces overlying the second insulative layer along portions of the transverse surfaces and the exterior major surface, the plurality of conductive traces being connected to the plurality of conductive features.

* * * * *